(12) United States Patent
Matsumoto

(10) Patent No.: US 12,170,282 B2
(45) Date of Patent: Dec. 17, 2024

(54) SEMICONDUCTOR DEVICE WITH FIN TRANSISTORS AND MANUFACTURING METHOD OF SUCH SEMICONDUCTOR DEVICE

(71) Applicant: Sony Corporation, Tokyo (JP)

(72) Inventor: Koichi Matsumoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 18/485,440

(22) Filed: Oct. 12, 2023

(65) Prior Publication Data

US 2024/0047461 A1 Feb. 8, 2024

Related U.S. Application Data

(60) Continuation of application No. 17/399,222, filed on Aug. 11, 2021, now Pat. No. 11,824,057, which is a
(Continued)

(30) Foreign Application Priority Data

Oct. 29, 2010 (JP) ................................ 2010-243251

(51) Int. Cl.
*H01L 27/092* (2006.01)
*H01L 21/28* (2006.01)
(Continued)

(52) U.S. Cl.
CPC .... *H01L 27/0924* (2013.01); *H01L 21/28079* (2013.01); *H01L 21/28088* (2013.01);
(Continued)

(58) Field of Classification Search
None
See application file for complete search history.

(56) References Cited

U.S. PATENT DOCUMENTS

| 5,827,761 A | 10/1998 | Fulford et al. |
| 6,333,540 B1 | 12/2001 | Shiozawa et al. |

(Continued)

FOREIGN PATENT DOCUMENTS

| CN | 1731588 A | 2/2006 |
| CN | 101013700 | 8/2007 |

(Continued)

OTHER PUBLICATIONS

Japanese Office Action issued in connection with related Japanese patent application No. 2010-243251 dated Jul. 1, 2014.
(Continued)

*Primary Examiner* — Cory W Eskridge
(74) *Attorney, Agent, or Firm* — DENTONS US LLP

(57) ABSTRACT

A semiconductor device and method of making same. The semiconductor device includes: a first conductivity type transistor and a second conductivity type transistor, wherein each of the first conductivity type transistor and the second conductivity type includes a gate insulating film formed on a base, a metal gate electrode formed on the gate insulating film, and side wall spacers formed at side walls of the metal gate electrode, wherein the gate insulating film is made of a high dielectric constant material, and wherein offset spacers are formed between the side walls of the metal gate electrode and the inner walls of the side wall spacers in any one of the first conductivity type transistor and the second conductivity type transistor, or offset spacers having different thicknesses are formed in the first conductivity type transistor and the second conductivity type transistor.

9 Claims, 15 Drawing Sheets

Related U.S. Application Data continuation of application No. 17/023,611, filed on Sep. 17, 2020, now Pat. No. 11,121,133, which is a continuation of application No. 16/443,319, filed on Jun. 17, 2019, now Pat. No. 10,811,416, which is a division of application No. 15/588,072, filed on May 5, 2017, now Pat. No. 10,373,955, which is a continuation of application No. 15/080,657, filed on Mar. 25, 2016, now Pat. No. 9,741,814, which is a continuation of application No. 14/709,047, filed on May 11, 2015, now Pat. No. 9,331,077, which is a continuation of application No. 13/278,809, filed on Oct. 21, 2011, now Pat. No. 9,059,312.

(51) Int. Cl.

| | |
|---|---|
| H01L 21/8238 | (2006.01) |
| H01L 29/06 | (2006.01) |
| H01L 29/08 | (2006.01) |
| H01L 29/417 | (2006.01) |
| H01L 29/423 | (2006.01) |
| H01L 29/49 | (2006.01) |
| H01L 29/51 | (2006.01) |
| H01L 29/66 | (2006.01) |

(52) U.S. Cl.
CPC ........... *H01L 21/28097* (2013.01); *H01L 21/823814* (2013.01); *H01L 21/823821* (2013.01); *H01L 21/823828* (2013.01); *H01L 21/823842* (2013.01); *H01L 21/82385* (2013.01); *H01L 21/823864* (2013.01); *H01L 27/092* (2013.01); *H01L 27/0928* (2013.01); *H01L 29/0649* (2013.01); *H01L 29/0847* (2013.01); *H01L 29/41783* (2013.01); *H01L 29/42356* (2013.01); *H01L 29/42376* (2013.01); *H01L 29/4958* (2013.01); *H01L 29/4966* (2013.01); *H01L 29/4975* (2013.01); *H01L 29/4983* (2013.01); *H01L 29/517* (2013.01); *H01L 29/66545* (2013.01); *H01L 29/66553* (2013.01); *H01L 29/6656* (2013.01)

(56) References Cited

U.S. PATENT DOCUMENTS

| | | | |
|---|---|---|---|
| 6,908,801 | B2 | 6/2005 | Saito |
| 7,622,340 | B2 | 11/2009 | Akaska et al. |
| 7,952,142 | B2 | 5/2011 | Wu |
| 8,247,281 | B2 | 8/2012 | Hempel et al. |
| 8,273,632 | B2 | 9/2012 | Lin et al. |
| 8,580,625 | B2 | 11/2013 | Lu et al. |
| 11,824,057 | B2 * | 11/2023 | Matsumoto ..... H01L 21/823842 |
| 2004/0061185 | A1 | 4/2004 | Doyle et al. |
| 2005/0019993 | A1 | 1/2005 | Lee et al. |
| 2005/0158935 | A1 * | 7/2005 | Shin ................. H01L 29/66553 |
| | | | 438/303 |
| 2005/0233527 | A1 * | 10/2005 | Brask ................. H01L 29/66545 |
| | | | 438/287 |
| 2006/0071275 | A1 | 4/2006 | Brask et al. |
| 2006/0091432 | A1 | 5/2006 | Guha et al. |
| 2006/0157797 | A1 | 7/2006 | Tateshita |
| 2006/0189043 | A1 | 8/2006 | Schultz |
| 2007/0178634 | A1 | 8/2007 | Jung et al. |
| 2007/0284671 | A1 | 12/2007 | Tsutsumi |
| 2008/0001224 | A1 | 1/2008 | Kinoshita |
| 2008/0135972 | A1 | 6/2008 | Ikuta |
| 2008/0149984 | A1 | 6/2008 | Chang et al. |
| 2009/0011610 | A1 | 1/2009 | Bojarczuk et al. |
| 2009/0039445 | A1 | 2/2009 | Wu |
| 2009/0170339 | A1 | 7/2009 | Trentzsch et al. |
| 2009/0189201 | A1 | 7/2009 | Chang et al. |
| 2009/0212332 | A1 | 8/2009 | Wang et al. |
| 2010/0065925 | A1 | 3/2010 | Hung et al. |
| 2010/0065926 | A1 | 3/2010 | Yeh et al. |
| 2010/0065928 | A1 | 3/2010 | Yasutake |
| 2010/0210079 | A1 | 8/2010 | Masuoka |
| 2011/0186915 | A1 | 8/2011 | Schelper et al. |
| 2011/0278676 | A1 | 11/2011 | Cheng et al. |
| 2012/0025323 | A1 | 2/2012 | Teo |
| 2013/0020657 | A1 | 1/2013 | Lu et al. |
| 2013/0334690 | A1 | 12/2013 | Tsaid et al. |

FOREIGN PATENT DOCUMENTS

| | | |
|---|---|---|
| CN | 101174587 | 5/2008 |
| JP | 11-241350 | 9/1999 |
| JP | 2001-015749 | 1/2001 |
| JP | 2001-308318 | 11/2001 |
| JP | 2002093927 A | 3/2002 |
| JP | 2002-110815 | 4/2002 |
| JP | 2002-164535 | 6/2002 |
| JP | 2002-289851 | 10/2002 |
| JP | 2005-259945 | 9/2005 |
| JP | 2008-244331 | 3/2007 |
| JP | 2007-134432 | 5/2007 |
| JP | 2008-193060 | 8/2008 |
| JP | 2009182317 A | 8/2009 |
| JP | 2009-224386 | 10/2009 |
| JP | 2009-278042 | 11/2009 |
| JP | 2010-171137 | 8/2010 |
| JP | 2010-212507 | 9/2010 |
| JP | 2011-108825 | 6/2011 |
| JP | 2011-165973 | 8/2011 |
| JP | 2001-284466 | 10/2011 |
| TW | 200731401 | 8/2007 |
| TW | 200731410 A | 8/2007 |

OTHER PUBLICATIONS

Chinese Patent Office Action issued in corresponding to Chinese Patent Application No. 201510969631.9 dated Dec. 7, 2017 with English translation.

Chinese Patent Office Action issued in corresponding Chinese Patent Application No. 201810372155.6 dated Apr. 3, 2019 with English translation.

* cited by examiner

SEMICONDUCTOR DEVICE WITH FIN TRANSISTORS AND MANUFACTURING METHOD OF SUCH SEMICONDUCTOR DEVICE

RELATED APPLICATION DATA

This application is as continuation of U.S. Ser. No. 17/399,222 filed Aug. 11, 2021, which is a continuation of U.S. patent application Ser. No. 17/023,611 filed Sep. 17, 2020, now U.S. Pat. No. 11,121,133 issued Sep. 14, 2021, which is a continuation of U.S. patent application Ser. No. 16/443,319 filed Jun. 17, 2019, now U.S. Pat. No. 10,811, 416 issued Oct. 20, 2020, which is a division of U.S. patent application Ser. No. 15/588,072 filed May 5, 2017, now U.S. Pat. No. 10,373,955 issued Aug. 6, 2019, which is a continuation of U.S. patent application Ser. No. 15/080,657 filed Mar. 25, 2016, now U.S. Pat. No. 9,741,814 issued Aug. 22, 2017, which is a continuation of U.S. patent application Ser. No. 14/709,047 filed May 11, 2015, now U.S. Pat. No. 9,331,077 issued May 3, 2016, which is a continuation of U.S. patent application Ser. No. 13/278,809 filed Oct. 21, 2011, now U.S. Pat. No. 9,059,312 issued Jun. 16, 2015, the entireties of which are incorporated herein by reference to the extent permitted by law. The present application contains subject matter related to and claims the benefit of priority to Japanese Patent Application No. JP 2010-243251 filed on Oct. 29, 2010 in the Japan Patent Office, the entirety of which is incorporated by reference herein to the extent permitted by law.

FIELD

The present disclosure relates to a semiconductor device and a manufacturing method of the semiconductor device using a metal gate electrode.

BACKGROUND

In the related art, the integration degree of a semiconductor device has doubled every eighteen to twenty-four months according to Moore's law. However, a gate tunnel leakage current around the 90 nm node may not be disregarded, and thus a gate oxide film of MOSFET has almost completely stopped being thinned. In addition, since it is difficult to control the short channel effect, a reduction in the gate length has slowly progressed.

As a result, it is difficult to improve the performance of the MOSFET itself, engineering for mobility improvement has been performed using a mechanical stress such as DSL (Dual Stress Liner) or embedded SiGe on or beyond the 90 nm node. A mechanical stress technique considered in terms of manufacturing is substantially employed up to the 45 nm node. Beyond the 45 nm node, scaling of a gate oxide film has started to progress by heightening the dielectric constant of the gate oxide film with an HKMG structure using a high dielectric constant (HK: high-k) and metal gate (MG) electrode.

The HKMG structure is manufactured mainly using two kinds of methods such as gate-first and gate-last methods.

In the gate-first method, a poly-Si gate structure or an SiON gate insulating film structure in the related art is only replaced with the HKMG structure, and thus the structure is relatively simple.

On the other hand, in the gate-last method, a poly-Si dummy gate electrode structure which is initially formed is replaced with the HKMG structure after an interlayer insulating layer is removed (for example, refer to JP-A-2007-134432). For this reason, the manufacturing method thereof is greatly different from that of a semiconductor device in the related art. There are many cases where, in the gate-last structure, metals having different work functions are employed in the NMOS and PMOS using the same high-k (HK) insulation layer. In addition, since very fine patterns are processed, the gate length which is patterned is desired to be arranged with regularity so as to be constant for ease of manufacturing.

Here, FIG. 14 shows a semiconductor device having the HKMG structure in the related art. In addition, FIG. 15 shows a gate-last manufacturing process as a manufacturing method of the semiconductor device having the HKMG structure in the related art.

The semiconductor device 60 shown in FIG. 14 includes, a semiconductor base 61 provided with a predetermined element separation and diffusion regions, gate electrodes 62 and 63 formed on the semiconductor base 61, and an interlayer insulating layer 64. The gate electrode 62 has a metal gate electrode 68 formed via an HK insulating layer 65, a Pfet WF (Work Function) metal layer 66, and an Nfet WF (Work Function) metal 67 on the semiconductor base 61. The gate electrode 63 has a metal gate electrode 68 formed via an HK insulating layer 65 and an Nfet WF (Work Function) metal 67 on the semiconductor base 61. Further, the gate electrode 62 and the gate electrode 63 have side wall spacers 69 formed at the side walls of the metal gate electrodes 68.

Next, a manufacturing method of the semiconductor device 60 shown in FIG. 14 will be described.

First, as shown in FIG. 15A, a gate insulating film 72 and a dummy gate electrode 71 are formed on the semiconductor base 61. The dummy gate electrode 71 is formed as follows. The gate insulating film 72 is formed on the semiconductor base 61 through, for example, dry oxidation ($O_2$, 700° C.), and then a dummy gate electrode material layer is formed on the gate insulating film 72 using a CVD method or the like. In addition, a resist pattern is formed on the dummy gate electrode material layer using lithography. Anisotropic etching is performed for the gate insulating film 72 and the dummy gate electrode material layer using the resist as a mask, thereby forming the dummy gate electrode 71. At this time, since a very fine pattern is processed, the resist pattern which is formed on the dummy gate electrode material layer using the lithography is formed with a specific size for ease of manufacturing.

In addition, a $Si_3N_4$ layer or the like is formed using a plasma CVD method and then is etched back, thereby forming the side wall spacers 69 at the side walls of the dummy gate electrodes 71. Further, the interlayer insulating layer 64 is formed on the semiconductor base 61 so as to cover the dummy gate electrodes 71 and the side wall spacers 69, and is planarized using a CMP method.

Thereafter, as shown in FIG. 15B, the dummy gate electrodes 71 are removed using a dry etching method or a wet etching method, so as to open insides of the side wall spacers 69.

Further, as shown in FIG. 15C, the HK insulating layer 65, the Pfet WF metal layer 66, and the Nfet WF metal layer 67 are formed inside the grooves from which the dummy gate electrodes are removed. In addition, a low resistance gate material is buried in the grooves from which the dummy gate electrodes are removed, and the metal gate electrodes 68 are formed by planarizing the interlayer insulating layer 64 using a CMP method.

Through the above-described process, it is possible to manufacture the semiconductor device having the HKMG structure in the related art shown in FIG. 14.

SUMMARY

However, there are cases where the gate length is optimized with the NMOS and the PMOS in order to reduce gate capacitance in an advanced CMOS. The gate length is optimized so as to have as a small value as possible in a range allowed by the short channel effect. However, in a case of forming a very fine pattern using lithography, if the gate length of the dummy gates is different in the NMOS and the PMOS, a burden is greatly increased in the lithography process, and thus manufacturing costs are increased. In other words, it is difficult to manufacture the optimized gate length such that the patterned gate length is arranged with regularity so as to be constant.

In addition, in a planar type structure in the related art, the gate length is defined at the bottom of the gate electrode. However, in a fin structure which may be employed beyond a 22 nm generation, the shape of the gate side wall also influences the gate length. In other words, a difference occurs in the gate length in a case where the side wall of the gate electrode is tapered or in a case where roughness is present in the side wall. Particularly, the difference in the gate length is greatly problematic in the processes when an effective gate width is increased by heightening the fin.

Thus, it is desirable to provide a semiconductor device capable of optimizing the gate length in the semiconductor device having a fine structure.

An embodiment of the present disclosure is directed to a semiconductor device including gate insulating films made of a high dielectric constant material and formed on a base, metal gate electrodes formed on the gate insulating films, side wall spacers formed at side walls of the metal gate electrodes, and offset spacers formed between the side walls of the metal gate electrodes and inner walls of the side wall spacers.

Here, the offset spacers are formed in any one of a first conductivity type transistor and a second conductivity type transistor. Alternatively, the offset spacers having different thicknesses are formed in the first conductivity type transistor and the second conductivity type transistor.

Another embodiment of the present disclosure is directed to a semiconductor device including gate insulating films made of a high dielectric constant material and formed on a base, metal gate electrodes formed on the gate insulating films, and offset spacers formed at side walls of the metal gate electrodes. In addition, each of the gate insulating films is continuously formed from a bottom of the metal gate electrode to the inner walls of the side wall spacers, which is formed at side walls of the metal gate electrodes via the offset spacers, and the gate insulating film is interposed between the offset spacers and the side wall spacers.

Still another embodiment of the present disclosure is directed to a semiconductor device including gate insulating films made of a high dielectric constant material and formed on a base, WF metal layers formed on the gate insulating films, and buried metal layers formed on the WF metal layers, offset spacers formed at side walls of the buried metal layers on the WF metal layers, and side wall spacers formed at side walls of the buried metal layers via the offset spacers.

Yet another embodiment of the present disclosure is directed to a manufacturing method of a semiconductor device including forming a first conductivity type semiconductor region and a second conductivity type semiconductor region on a base. In addition, the manufacturing method of the semiconductor device further includes forming dummy gate electrodes on the base, and forming side wall spacers at side walls of the dummy gate electrodes, and further forming an interlayer insulating layer which buries the side wall spacers therein and exposes upper surfaces of the dummy gate electrodes, and removing the dummy gate electrodes, in the first conductivity type semiconductor region and the second conductivity type semiconductor region.

In addition, the manufacturing method includes forming offset spacers at the inner walls of the side wall spacers in any one of the first conductivity type semiconductor region and the second conductivity type semiconductor region, or forming offset spacers having different thicknesses at the inner walls of the side wall spacers in the first conductivity type semiconductor region and the second conductivity type semiconductor region.

Further, the manufacturing method includes forming gate insulating films made of a high dielectric constant material on the exposed base inside the side wall spacers, and forming metal gate electrodes on the gate insulating films.

Still yet another embodiment of the present disclosure is directed to a manufacturing method of a semiconductor device including forming dummy gate electrodes on the base, forming side wall spacers and an interlayer insulating layer, removing the dummy gate electrodes, forming gate insulating films made of a high dielectric constant material on the exposed base inside the side wall spacers and at the inner walls of the side wall spacers, forming offset spacers at side walls of the gate insulating film, and forming metal gate electrodes on the gate insulating films and at the inner walls of the offset spacers.

Further another embodiment of the present disclosure is directed to a manufacturing method of a semiconductor device including forming gate insulating films made of a high dielectric constant material on a base, forming WF metal layers on the gate insulating films, forming dummy gate electrodes on the WF metal layers, forming side wall spacers at side walls of the dummy gate electrodes, forming an interlayer insulating layer which buries the side wall spacers therein and exposes upper surfaces of the dummy gate electrodes, removing the dummy gate electrodes, forming offset spacers on the exposed WF metal layers inside the side wall spacers and at the inner walls of the side wall spacers, and forming buried metal layers on the gate insulating layers and at the inner wall sides of the offset spacers.

In the semiconductor device according to the embodiments of the present disclosure, and the semiconductor device manufactured according to the embodiments of the present disclosure, the gate length of a transistor is limited by offset spacers formed between metal gate electrodes and side wall spacers. Therefore, a formation region of the metal gate electrodes can be controlled at an arbitrary size by the offset spacers regardless of the size of the region of the inner wall sides of the side wall spacers. For this reason, it is possible to optimize of the gate length of a semiconductor device where a fine pattern is formed.

According to the embodiments of the present disclosure, it is possible to provide a semiconductor device having a fine structure and capable of optimizing the gate length.

DETAILED DESCRIPTION

Hereinafter, preferred embodiments for implementing the present disclosure will be described; however, the present disclosure is not limited to the following examples.

In addition, the description will be made in the following order.

1. SEMICONDUCTOR DEVICE ACCORDING TO FIRST EMBODIMENT
2. MANUFACTURING METHOD OF SEMICONDUCTOR DEVICE ACCORDING TO FIRST EMBODIMENT
3. SEMICONDUCTOR DEVICE ACCORDING TO SECOND EMBODIMENT
4. MANUFACTURING METHOD OF SEMICONDUCTOR DEVICE ACCORDING TO SECOND EMBODIMENT
5. SEMICONDUCTOR DEVICE ACCORDING TO THIRD EMBODIMENT
6. MANUFACTURING METHOD OF SEMICONDUCTOR DEVICE ACCORDING TO THIRD EMBODIMENT
7. SEMICONDUCTOR DEVICE ACCORDING TO FOURTH EMBODIMENT (FIN TYPE)
8. MANUFACTURING METHOD OF SEMICONDUCTOR DEVICE ACCORDING TO FOURTH EMBODIMENT (FIN TYPE)

1. Semiconductor Device According to First Embodiment

Figure 1:
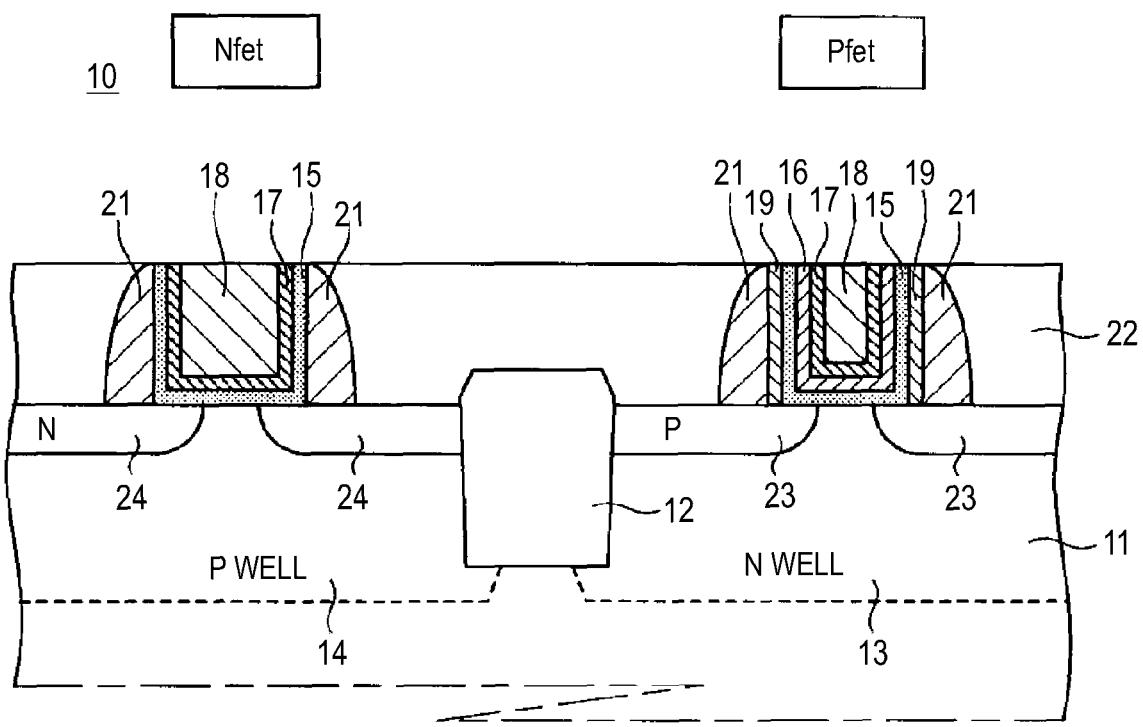
FIG. 1 is a diagram illustrating a configuration of a semiconductor device according to a first embodiment of the present disclosure.

FIG. 1 is a schematic configuration diagram of a semiconductor device according to the first embodiment. The semiconductor device 10 shown in FIG. 1 includes an N type FET (Field Effect Transistor) region (hereinafter, referred to as an Nfet region) having a planar structure and a P type FET region (hereinafter, referred to as a Pfet region), and has a configuration where an offset spacer is formed in one gate electrode. In addition, in the following description, the first conductivity type of the semiconductor device is a P type, and the second conductivity type thereof is an N type.

The semiconductor device 10 shown in FIG. 1 is provided with an element separation 12 made of silicon oxide or the like, which partitions active regions, on a semiconductor base 11 formed from, for example, a silicon substrate or the like. In addition, an N well region 13 is formed in the active region of the Pfet region, and a P well region 14 is formed in the active region of the Nfet region.

In the Nfet region, a buried metal layer 18 is formed via an HK insulating layer 15 and an Nfet WF (Work Function) metal layer 17 on the semiconductor base 11. In addition, in the Pfet region, a buried metal layer 18 is formed via an HK insulating layer 15, a Pfet WF metal layer 16, and an Nfet WF metal layer 17 on the semiconductor base 11.

The semiconductor device 10 has a metal gate electrode formed of the Pfet WF metal layer 16 or the Nfet WF metal layer 17 and the buried metal layer 18.

The HK insulating layer 15 is a high-k insulating layer having the dielectric constant higher than silicon oxide. As the high-k layer, HfO, HfSiO, LaO, ZrO, ZrSiO, TaO, TiO, BaSrTiO, BaTiO, StTiO, YO, AlO, PbScTaO, and the like may be used. In addition, the HK insulating layer 15 and the silicon oxide film may form the gate insulating film together.

The buried metal layer 18 is made of a pure metal material, an alloy or a metal compound, and, for example, is made of Ti, Al, Cu, and W, or alloys including the metals.

In the Nfet region and the Pfet region, side wall spacers 21 are formed at the side walls of the buried metal layers 18. In addition, in the Pfet region, offset spacers 19 are formed at the inner walls of the side wall spacers 21 of the metal gate electrode. For this reason, the Pfet region has a multi-layer body formed of the offset spacers 19, the HK insulating layer 15, the Pfet WF metal layer 16, and the Nfet WF metal layer 17 from the inner walls of the side wall spacers 21. Further, the buried metal layer 18 is formed at the inside surrounded by the multi-layer body.

The side wall spacers 21 are made of SiN, $SiO_2$, or the like, and are formed of a single layer or a plurality of layers. In addition, SiN, $SiO_2$, or the like is used for the offset spacers 19.

The offset spacers 19 are formed in order to adjust the gate length of each of the Nfet region and the Pfet region.

In the Nfet region and the Pfet region, opening portions of the side wall spacers 21 are preferably formed with the same size. This is because patterning is desired to be designed with regularity so as to be constant for ease of manufacturing in a case of processing a fine pattern. The sizes of the opening portions of the side wall spacers 21 are determined by patterning the gate electrodes in the lithography process, and thus the same pattern is preferable. Particularly, in a case of forming the gate electrodes, the length in the gate longitudinal direction becomes fine. For this reason, the lengths of the gate electrodes in the gate longitudinal direction are formed so as to be the same as each other in the Nfet region and the Pfet region, and thereby a burden in the lithography process can be reduced.

However, if the lithography process is performed with the same pattern in the Nfet region and the Pfet region, the gate length may not be optimized so as to match each diffusion layer profile. Therefore, the sizes of the opening portions are adjusted by forming the offset spacers 19 inside the opening portions of the side wall spacers 21. The offset spacers 19 are formed on the inner walls of the side wall spacers 21, and thereby it is possible to adjust ranges which the WF metal layers 16 are formed inside the opening portions. For this reason, the gate lengths can be optimized at arbitrary lengths.

In the semiconductor device 10 shown in FIG. 1, the gate length of the Pfet region having the offset spacers 19 is smaller than that of the Nfet region which does not have the offset spacers 19. In addition, the offset spacers may be formed in both of the Pfet region and the Nfet region as well as being formed only in the Pfet region. In a case where the offset spacers are formed in both of the Pfet region and the Nfet region, the thicknesses of the offset spacers of the Pfet region and the Nfet region are not particularly limited. For example, in the Pfet region and the Nfet region, the offset spacers having the same thickness may be formed, or the offset spacers having the different thicknesses may be formed. Particularly, the thicknesses of the offset spacers are preferably adjusted in the Pfet region and the Nfet region in order to optimize the gate length in each MOS.

Source/drain 23 which is a P type impurity diffusion region, or source/drain 24 which is an N type impurity diffusion region is formed in the semiconductor base 11 which is located at both sides of the buried metal layer 18 and directly under the side wall spacers 21. The sources/drains 23 and 24 have LDDs (Lightly Doped Drains) and halo (not shown) formed therein. In addition, the surface layers of the sources/drains 23 and 24 exposed from the side wall spacers 21 become silicide. The silicide of the sources/drains 23 and 24 is formed from, for example, a cobalt silicide, a nickel silicide, a platinum silicide, or the like.

In the semiconductor device according to the first embodiment, the offset spacers are formed on the lateral surfaces of the metal gate electrodes and the WF metal layers. For this reason, the gate length can be arbitrarily set by changing the thicknesses of the offset spacers. Therefore, even if the dummy gate electrodes and the side wall spacers are formed with the same pattern in the lithography process, it is possible to configure the semiconductor device having the optimized gate length in each region.

2. Manufacturing Method of Semiconductor Device According to First Embodiment

Next, a manufacturing method of the semiconductor device according to the first embodiment will be described.

Formation of Element Separation

First, $SiO_2$ and $Si_3N_4$ are sequentially formed on the semiconductor base 11 formed from a silicon substrate. In addition, a resist is patterned at parts where active regions are formed. The $Si_3N_4$, the $SiO_2$, and the semiconductor base 11 are sequentially etched using the formed resist pattern as a mask, thereby forming a trench (a trench region). At this time, the etching is performed until the depth of the trench of the semiconductor base 11 becomes 350 to 400 nm. The region where the $Si_3N_4$ is patterned becomes an active region, and the trench region becomes a field oxide film.

Thereafter, the trench region is buried in the $SiO_2$. For example, it is possible to form a film which has a good step coating property and is precise, by the use of a high density plasma CVD method or the like. The surface is planarized through CMP (Chemical Mechanical Polish). Polishing is performed through the CMP until the $SiO_2$ film on the $Si_3N_4$ is removed in the $Si_3N_4$ region.

Next, the $Si_3N_4$ is removed using, for example, hot phosphoric acid, thereby forming the active region.

On the surface of the part where the active region is formed, $SiO_2$ (sacrificial oxide film) of 10 nm is formed. Ion implantation for forming the P well region or forming a buried layer for suppressing punch-through, and ion implantation for adjusting a threshold value voltage (Vth) are performed in the Nfet forming region, thereby forming an Nfet channel region. Further, ion implantation for forming the N well region or forming a buried layer for suppressing punch-through, and ion implantation for adjusting a threshold value voltage (Vth) are performed in the Pfet forming region, thereby forming a Pfet channel region.

Figure 2A:
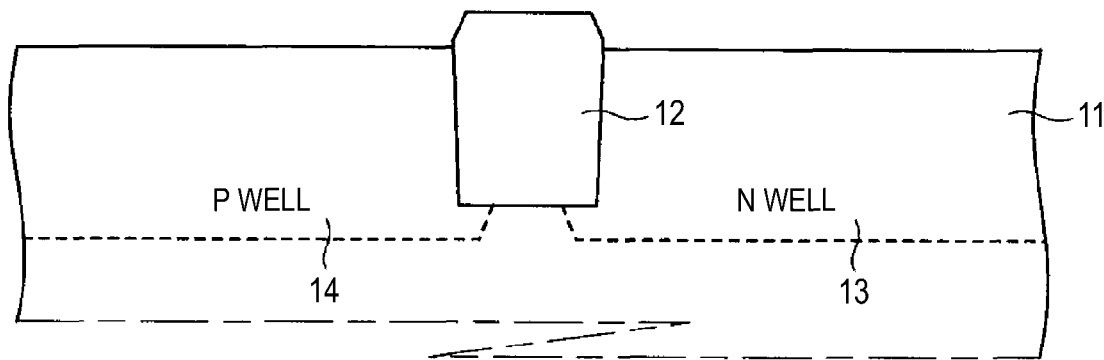
FIGS. 2A to 2C are diagrams illustrating a manufacturing process of the semiconductor device according to the first embodiment.

Through the above-described process, as shown in FIG. 2A, the N well region 13, the P well region 14, and the element separation 12 partitioning the two regions are formed on the semiconductor base 11.

Formation of Dummy Gate Electrode

Figure 2B:
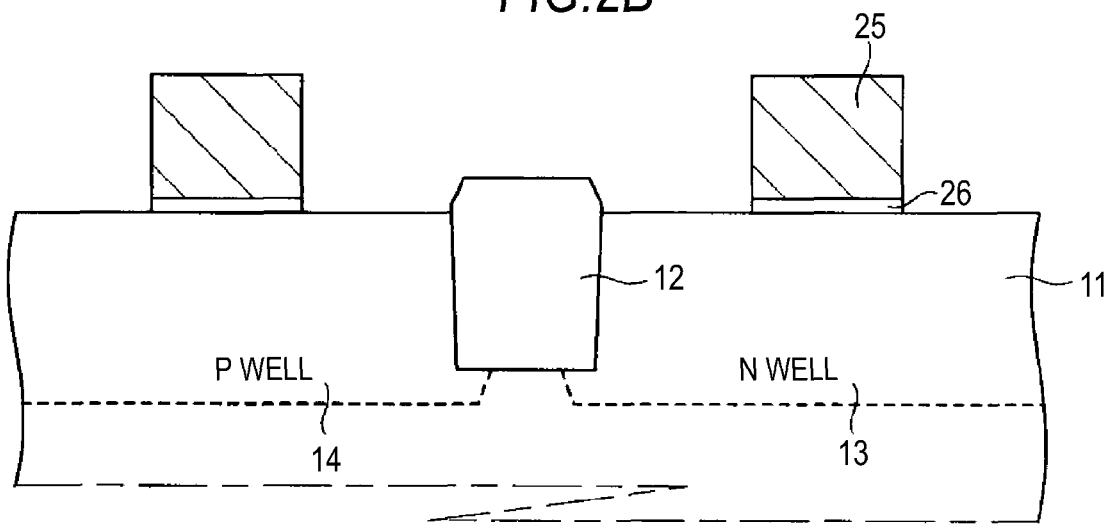

Next, as shown in FIG. 2B, dummy gate electrodes are formed on the N well region 13 and the P well region 14 of the semiconductor base 11.

First, the sacrificial oxide film which is provided on the semiconductor base 11 when the active region is formed is separated therefrom with a hydrogen fluoride (HF). After the separation, a gate insulating film 26 is formed with the thickness of about 1 to 3 nm through dry oxidation ($O_2$, 700° C.). As the oxidation gas, for example, a mixed gas of $H_2/O_2$, $N_2O$, and NO may be used in addition to the dry $O_2$. In addition, a furnace annealing treatment or a rapid thermal annealing (RTA) treatment may be used.

Next, a dummy gate electrode material layer is formed using a CVD method. The dummy gate electrode material layer is formed on the gate insulation film 26 by, for example, depositing poly-silicon or amorphous silicon with the thickness of 50 to 100 nm. Next, $Si_3N_4$ is deposited as a hard mask with the thickness of, for example, 50 to 100 nm, using an LP-CVD (Low Pressure-Chemical Vapor Deposition). After the deposition, an electrode pattern is formed on the $Si_3N_4$ hard mask using the lithography process, and then anisotropic etching is performed for the gate insulating film 26 and the dummy gate electrode material layer using the hard mask pattern. The dummy gate electrode material layer is patterned, and thereby the gate insulating films 26 and the dummy gate electrodes 25 are formed on the semiconductor base 11 as shown in FIG. 2B.

The patterns of the dummy gate electrodes are formed as the same shape in the Nfet region and the Pfet region. In a case of processing a fine pattern, patterning is desired to be designed with regularity so as to be constant for manufacturing easiness in the lithography process. For this reason, the dummy gate electrodes are formed as the same pattern in the Nfet region and the Pfet region, thereby reducing a burden in the lithography process. Particularly, in a case of forming the gate electrode, the length in the gate longitudinal direction becomes fine, and thus the lengths of the dummy gate electrodes in the gate longitudinal direction are preferably formed as the same pattern.

Formation of Diffusion Region

Figure 2C:
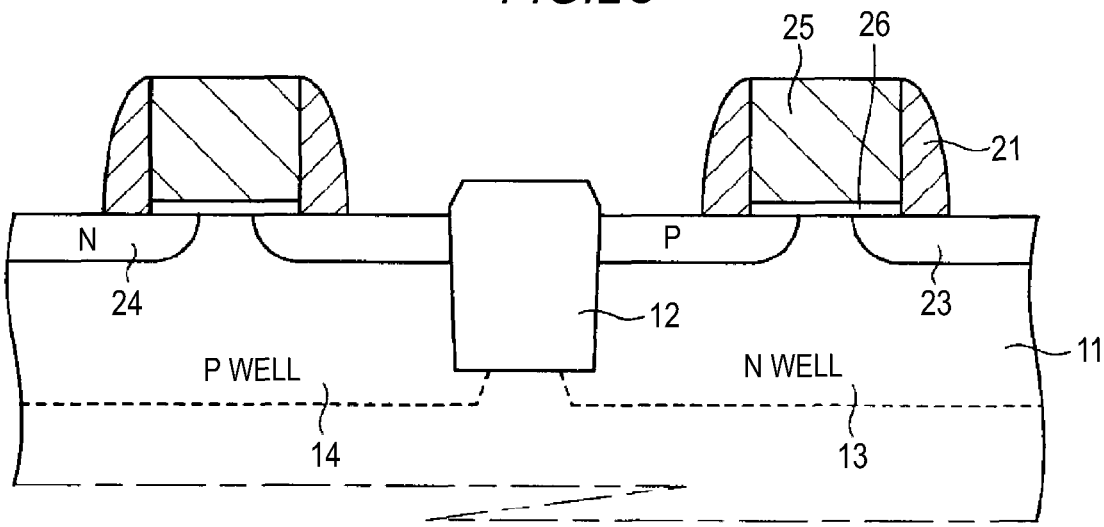

Next, as shown in FIG. 2C, the side wall spacers 21 are formed at the side walls of the dummy gate electrodes 25, and thereby the P type source/drain 23 is formed in the N well region 13, and the N type source/drain 24 is formed in the P well region 14.

First, the ion of $BF_2^+$ is implanted into the Pfet region at 3 to 5 keV and 5 to $20 \times 10^{14}/cm^2$, thereby forming a PLDD region. In addition, the ion of $As^+$ is implanted into the Nfet region at 5 to 10 keV and 5 to $20 \times 10^{14}/cm^2$, thereby forming an NLDD region.

In addition, in order to suppress the short channel effect, so-called halo having impurity concentration higher than the wells is implanted into the sources/drains along with the formation of the LDD. For example, the Nfet region is divided into four regions and undergoes tilt ion implantation using B at 12 keV, $3 \times 10^{13}/cm^2$, and 45°. In addition, the Pfet region is divided into four regions and undergoes tilt ion implantation using As at 70 keV, $2 \times 10^{13}/cm^2$, and 45°.

Formation of Side Wall Spacer

Next, the side wall spacers 21 are formed at the side walls of the dummy gate electrodes 25.

$Si_3N_4$ is deposited with the thickness of 50 to 150 nm on the semiconductor base 11 so as to cover the dummy gate electrodes 25 using a plasma CVD method. Thereafter, anisotropic etching is performed so as to etch back the $Si_3N_4$ layer, thereby forming the side wall spacers 21 at the side walls of the dummy gate electrodes 25. At this time, the $Si_3N_4$ which is a hard mask of the dummy gate electrodes 25 is made to remain.

Formation of Diffusion Region

Next, the ion of $BF_2^+$ is implanted into the N well region 13 at 5 to 10 keV and 1 to $2 \times 10^{15}/cm^2$, thereby forming the P type source/drain 23. In addition, the ion of $As^+$ is implanted into the P well region 14 at 40 to 50 keV and 1 to $2 \times 10^{15}/cm^2$, thereby forming the N type source/drain 24. After the ion implantation, the impurities are activated under the condition of 1000° C. and five seconds using the RTA (Rapid Thermal Annealing), thereby forming a MOSFET shown in FIG. 2C.

After the MOSFET is formed, resistance of the sources/drains 23 and 24 is reduced using a so-called SALICIDE (Self-Aligned siLICIDE) technique. For example, Ni is deposited with the thickness of 6 to 8 nm on the semiconductor base 11 through sputtering. The RTA is performed under the conditions of 300 to 500° C. and ten seconds, and thereby silicide (NiSi) is formed only on Si of the sources/drains 23 and 24. After the silicide is formed, unreacted Ni is removed by a chemical solution such as $H_2SO_4/H_2O_2$.

Next, SiN is formed with the thickness of 10 to 100 nm as a contact etching stopper (not shown). Two kinds of SiN may be formed separately so as to apply different mechanical stresses to the NMOS and the PMOS in the transistor.

Figure 3A:
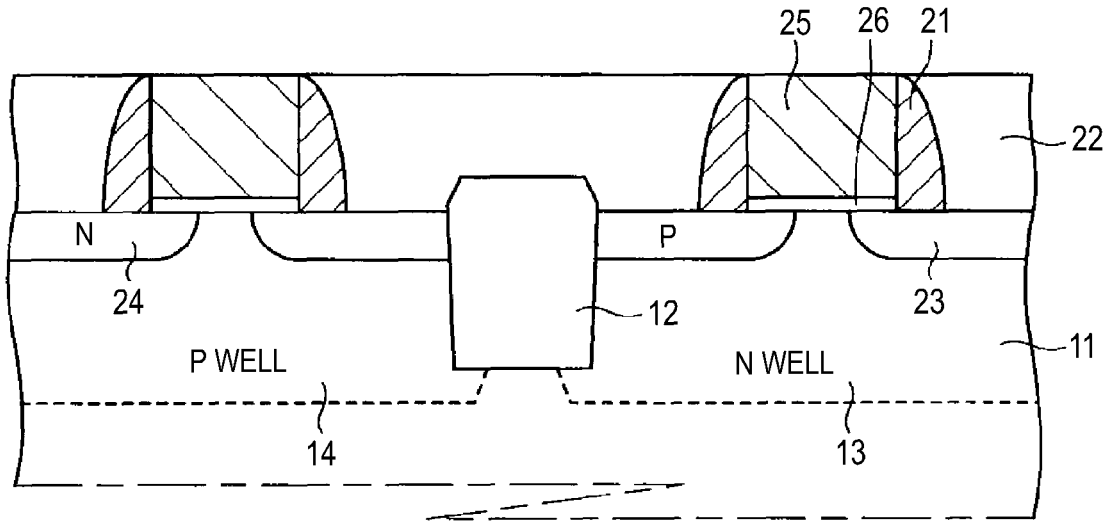
FIGS. 3A to 3C are diagrams illustrating the manufacturing process of the semiconductor device according to the first embodiment.

In addition, $SiO_2$ is deposited with the thickness of 100 to 1000 nm as the interlayer insulating layer 22 on the semiconductor base 11 so as to cover the dummy gate electrodes 25 and the side wall spacers 21. Further, as shown in FIG. 3A, the upper parts of the dummy gate electrodes 25 are exposed through planarization using a CMP method.

Removal of Dummy Gate

Figure 3B:
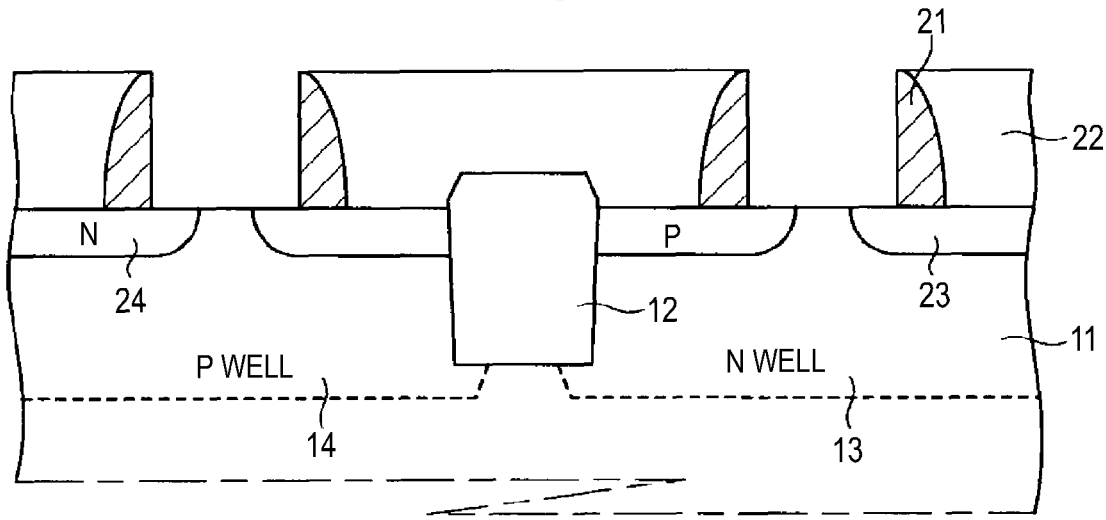

Next, as shown in FIG. 3B, the dummy gate electrodes 25 are removed so as to open the insides of the side wall spacers 21. In a case where the dummy gate electrodes 25 are made of poly-silicon or amorphous silicon, the dummy gate electrodes 25 are removed by a dry etching method, or a wet etching method using TMAH (Tetra methyl ammonium hydroxide). At this time, the $SiO_2$ formed as the gate insulating films 26 under the dummy gate electrodes 25 are also removed by a wet etching method or the like.

Formation of Offset Spacer

Figure 3C:
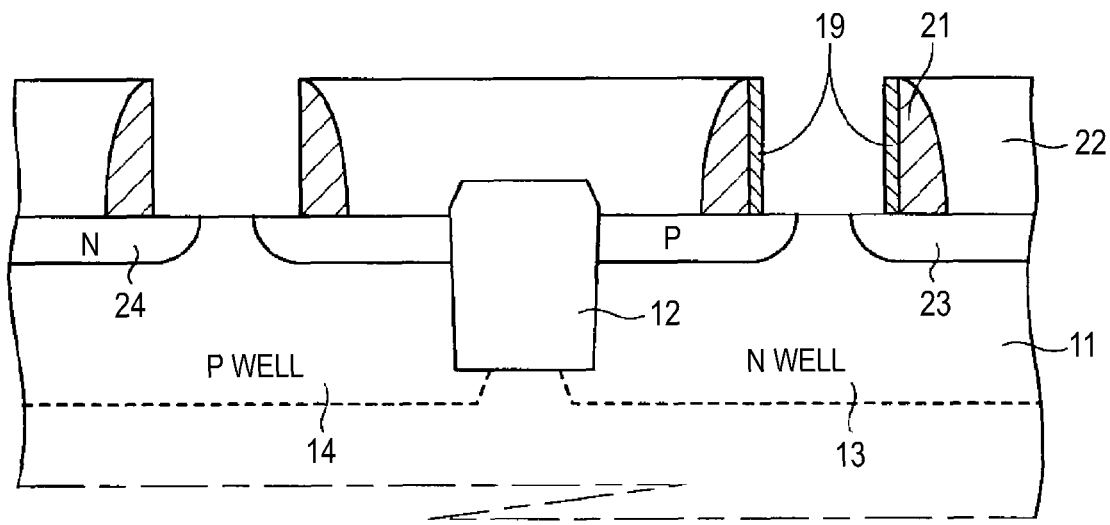

Next, as shown in FIG. 3C, the offset spacers 19 are formed at the inner walls of the side wall spacers 21 in the Pfet region.

First, an offset spacer material is formed in a range of 1 to 20 nm on the entire surface of the semiconductor base 11. In addition, the offset spacer material layer is etched back through anisotropic etching so as to form the offset spacers 19 at the inner walls of the grooves from which the dummy gate electrodes are removed. The offset spacer material uses SiN, $SiO_2$, or the like.

After the offset spacers 19 are formed, a resist layer is formed over the entire surface of the semiconductor base 11, and a resist pattern for opening the grooves from where the dummy gate electrodes are removed in the Nfet region is formed. The offset spacers formed at the inner walls of the side wall spacers 21 in the Nfet region are removed through the wet etching method using an HF solution or the like. For example, in a case where the offset spacers 19 are made of $SiO_2$, the upper part of the interlayer insulating layer 22 is also etched with the thickness of about 10 nm together with the offset spacer material layer through etch-back; however, the etched amount of this degree does not cause a particular problem in a configuration of the semiconductor device.

In addition, for example, in the above-described dummy gate removal process, the gate insulating films 26 are made to remain by removing only the dummy gate electrodes 25. In the offset spacer formation process, an offset spacer material layer is formed on the entire surface of the semiconductor base 11 including the dummy gate electrodes 25 using SiN. In addition, the offset spacer material layer is etched back through anisotropic etching, thereby etching the offset spacers in the Nfet region. The gate insulating films 26 are removed after the offset spacers 19 are formed in the Pfet region.

In the above-described method, the side wall spacers are made of SiN, thereby preventing the upper part of the interlayer insulating layer 22 from being etched when the offset spacer material layer is etched.

In addition, since the surface of the semiconductor base 11 is not exposed inside the grooves from which the dummy gate electrodes are removed when the offset spacer material layer is etched, it is possible to suppress the semiconductor base 11 from being damaged due to the etching.

Formation of HK Insulating Layer

Figure 4A:
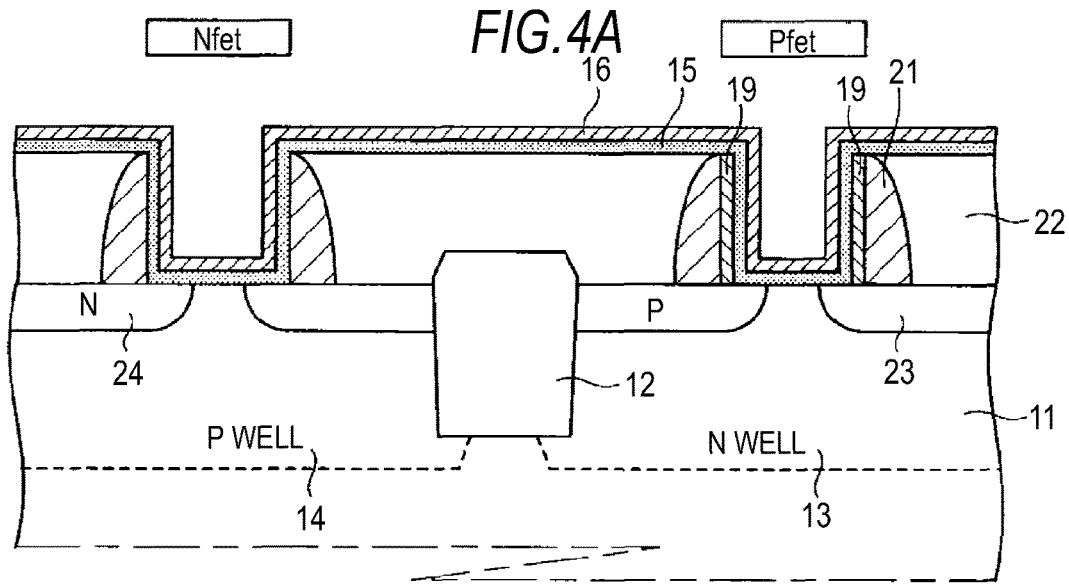
FIGS. 4A to 4C are diagrams illustrating the manufacturing process of the semiconductor device according to the first embodiment.

Next, as shown in FIG. 4A, a gate insulating layer is formed using the HK insulating layer 15.

The HK insulating layer 15 is formed over the entire surface of the semiconductor base 11 using an ALD (Atomic Layer Deposition) method or the like. The HK insulating layer 15 is formed using, for example, HfO, HfSiO, LaO, ZrO, ZrSiO, TaO, TiO, BaSrTiO, BaTiO, StTiO, YO, AlO, PbScTaO, and the like. In addition, there are cases where a ground of the HK insulating layer 15 mainly includes $SiO_2$. In this case, the $SiO_2$ is removed through plasma oxidation.

Formation of WF Metal Layer

After the HK insulating layer 15 is formed, WF (Work Function) metal layers are formed. A single metal electrode or separate metal electrodes are formed in the Nfet region and the Pfet region using the WF metal layers. Here, a case where different WF metal layers are formed in the Nfet region and the Pfet region will be described below.

First, the Pfet WF metal layer 16 is formed.

As shown in FIG. 4A, the Pfet WF metal layer 16 is formed in a range of 1 to 20 nm on the HK insulating layer 15 over the entire surface of the semiconductor base 11, using a CVD method, a PVD method, or an ALD method. The Pfet WF metal layer 16 has 5.2 eV as the optimal work function, and a material close to this value is used. For example, alloys including Ru, Pd, Pt, Co, Ni, and Mo, or an oxide, TiN and the like are used.

Next, the Pfet WF metal layer 16 is removed from the Nfet region by the dry etching method or the wet etching method. At this time, the HK insulating layer 15 in the Nfet region is not removed but is left. For example, a resist pattern or the like is formed on the part where the Pfet WF metal layer 16 is left in the Pfet region, and the Pfet WF metal layer 16 in the Nfet region is etched using the resist pattern as a mask. In a case where TiN is formed as the Pfet WF metal layer 16, the Pfet WF metal layer 16 is removed from the Nfet region using, for example, ammonia hydrogen peroxide.

Figure 4B:
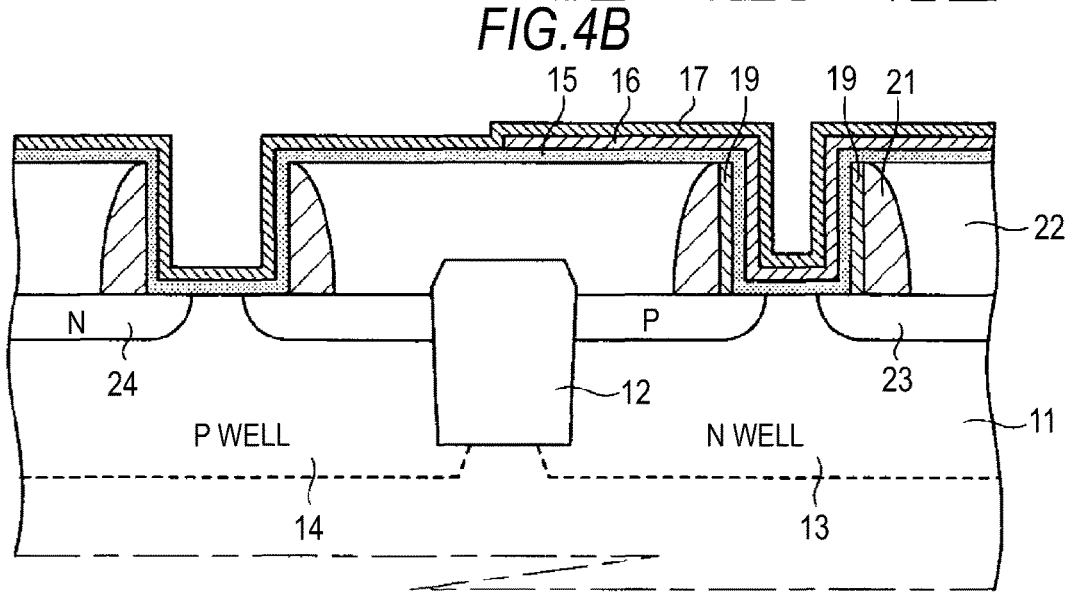

Next, as shown in FIG. 4B, the Nfet WF metal layer 17 is formed in a range of 1 to 20 nm on the Pfet WF metal layer 16 and the HK insulating layer 15, using a CVD method, a PVD method, or an ALD method. The Nfet WF metal layer 17 has 4.0 eV as the optimal work function, and a material close to this value is used. For example, alloys including Hf, Zr, Ti, Ta, and Al, or a carbide, HfSi, and the like are used.

Burying of Gate Metal

Figure 4C:
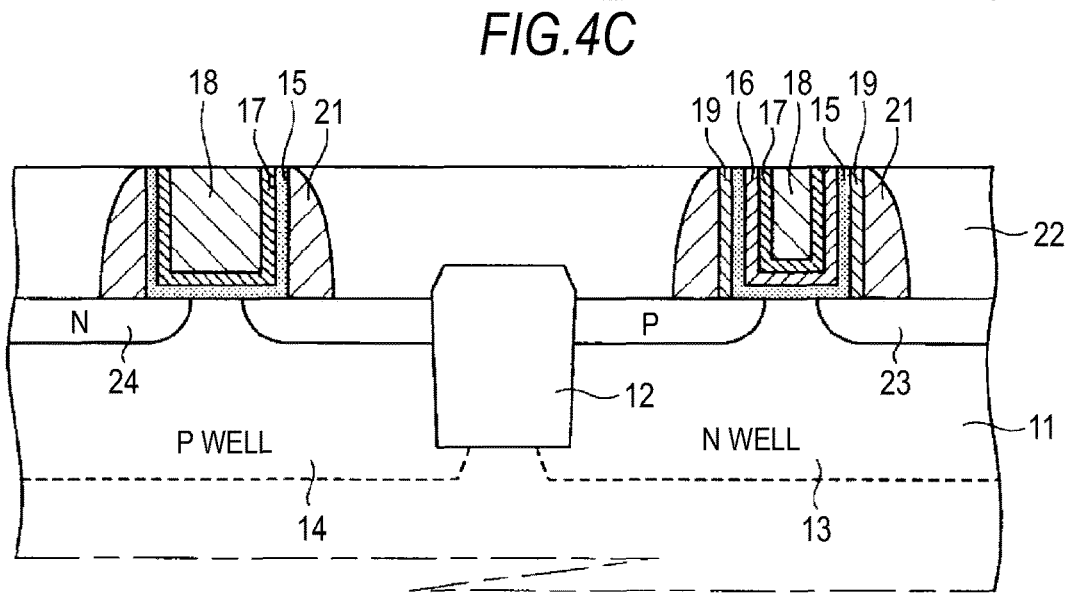

After the Pfet WF metal layer 16 and the Nfet WF metal layer 17 are formed, as shown in FIG. 4C, a low resistance gate material is buried in the grooves from where the dummy gate electrodes are removed, thereby forming the buried metal layers 18. As the low resistance gate material, for example, Ti, Al, Cu, and W, or alloys including the metals are used.

As described above, after the offset spacers 19 or the HK insulating layer 15 are formed in the grooves from which the dummy gate electrodes are removed, the low resistance gate material is buried therein so as to form the low resistance gate material layer, thereby obtaining the buried metal layer 18. In addition, planarization is performed by removing the low resistance gate layer, the Nfet WF metal layer 17, the Pfet WF metal layer 16, and the HK insulating layer 15 on the interlayer insulating layer 22 using a CMP method. That is to say, the Nfet WF metal layer 17, the Pfet WF metal layer 16, and the HK insulating layer 15 which are continuously formed on the interlayer insulating layer 22 are removed so as to be left only in the grooves when the buried metal layer 18 is formed.

The low resistance gate material is left only in the grooves from which the dummy gate electrodes are removed through this process, thereby forming the buried metal layers 18. In addition, in this process, the Nfet WF metal layer 17, the Pfet WF metal layer 16, and the buried metal layer 18 form a metal gate electrode.

Through the above-described processes, the semiconductor device 10 shown in FIG. 1 can be manufactured. According to the manufacturing method, only one process of the lithography process for removing the offset spacers 19 from the Nfet region is added to the manufacturing method of the gate-last structure in the related art, thereby manufacturing the semiconductor device according to the first embodiment.

3. Semiconductor Device According to Second Embodiment

Figure 5:
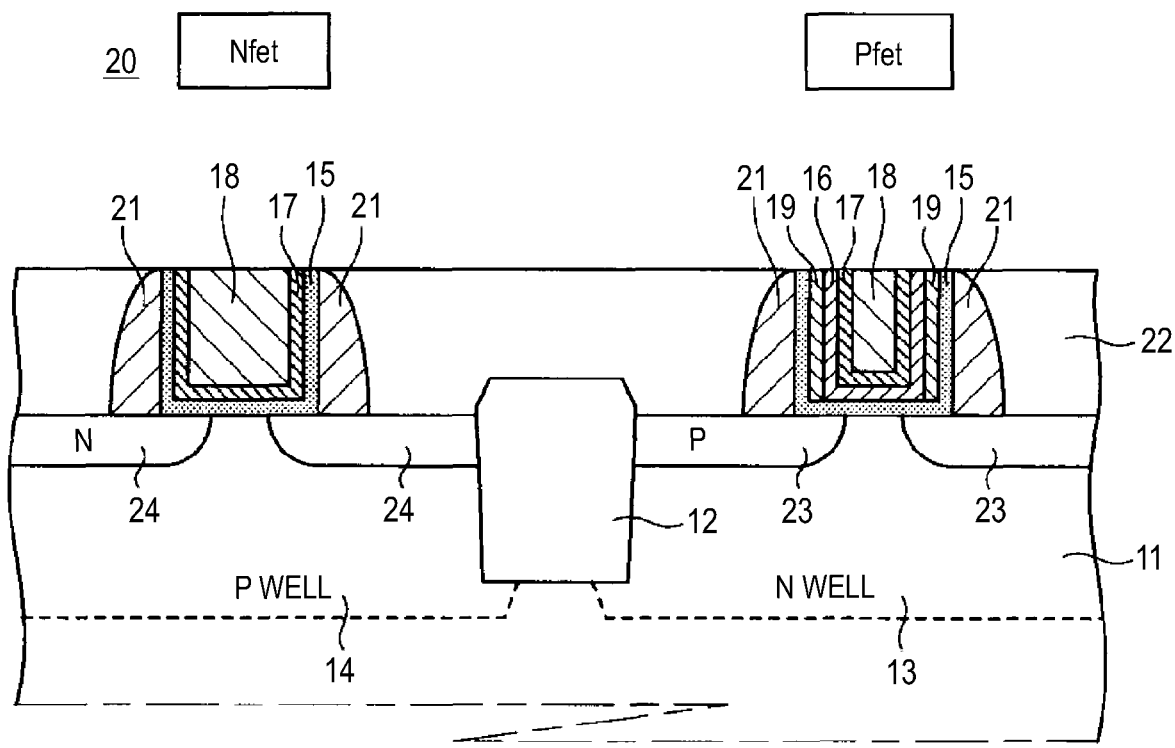
FIG. 5 is a diagram illustrating a configuration of a semiconductor device according to a second embodiment of the present disclosure.

FIG. 5 is a schematic configuration diagram of a semiconductor device according to the second embodiment. In the semiconductor device 20 shown in FIG. 5, the constituent elements which are the same as those of the semiconductor device 10 according to the first embodiment shown in FIG. 1 described above are given the same reference numerals, and description thereof will be omitted.

The semiconductor device 20 shown in FIG. 5 is provided with an element separation 12 made of silicon oxide or the like, which partitions active regions, on a semiconductor base 11 formed from, for example, a silicon substrate or the like. In addition, an N well region 13 is formed in the active region of the Pfet region, and a P well region 14 is formed in the active region of the Nfet region.

In the Nfet region, a buried metal layer 18 is formed via an HK insulating layer 15 and an Nfet WF (Work Function) metal layer 17 on the semiconductor base 11. In addition, in the Pfet region, a buried metal layer 18 is formed via an HK insulating layer 15, a Pfet WF metal layer 16, and an Nfet WF metal layer 17 on the semiconductor base 11.

The semiconductor device 20 has a metal gate electrode formed of the Pfet WF metal layer 16 or the Nfet WF metal layer 17 and the buried metal layer 18.

The HK insulating layer 15 is a high-k insulating layer having the dielectric constant higher than silicon oxide. As the high-k layer, HfO, HfSiO, LaO, ZrO, ZrSiO, TaO, TiO, BaSrTiO, BaTiO, StTiO, YO, AlO, PbScTaO, and the like may be used. In addition, the HK insulating layer 15 and the silicon oxide film may form the gate insulating film together.

The buried metal layer 18 is made of a pure metal material, an alloy or a metal compound, and, for example, is made of Ti, Al, Cu, and W, or alloys including the metals.

In the Nfet region and the Pfet region, side wall spacers 21 are formed at the side walls of the buried metal layers 18. In addition, in the Pfet region, offset spacers 19 are formed between the HK insulating layer 15 and the Pfet WF metal layer 16 at the side walls of the buried metal layers 18. For this reason, the Pfet region has a multi-layer body formed of the HK insulating layer 15, the offset spacers 19, the Pfet WF metal layer 16, and the Nfet WF metal layer 17 from the inner walls of the side wall spacers 21. Further, the buried metal layer 18 is formed at the inside surrounded by the multi-layer body.

The side wall spacers 21 are made of SiN, $SiO_2$, or the like, and are formed of a single layer or a plurality of layers. In addition, SiN, $SiO_2$, or the like is used for the offset spacers 19.

In the Pfet region, the gate length is determined depending on a range where the Pfet WF metal layer 16 is formed. For this reason, a formation range of the Pfet WF metal layer 16 can be controlled by forming the Pfet WF metal layer 16 at the inner walls of the HK insulating layer 15 via the offset spacers 19. The Pfet WF metal layer 16 can be formed with an arbitrary size inside the opening portion of the side wall spacer 21 by setting the offset spacers 19 to an arbitrary thickness. For this reason, an arbitrary gate length can be set without depending on the size of the opening portion of the side wall spacer 21.

In addition, the offset spacers may be formed in both of the Pfet region and the Nfet region as well as being formed only in the Pfet region as shown in FIG. 5. Further, each gate length may be optimized by changing the thicknesses of the offset spacers in the Pfet region and the Nfet region.

Source/drain 23 which is a P type impurity diffusion region, or source/drain 24 which is an N type impurity diffusion region is formed in the semiconductor base 11 which is located at both sides of the buried metal layer 18 and directly under the side wall spacers 21. The sources/drains 23 and 24 have LDDs (Lightly Doped Drains) and halo (not shown) formed therein. In addition, the surface layers of the sources/drains 23 and 24 exposed from the side wall spacers 21 become silicide. The silicide of the sources/drains 23 and 24 is formed from, for example, a cobalt silicide, a nickel silicide, a platinum silicide, or the like.

In the semiconductor device according to the second embodiment, the offset spacers are formed between the lateral surfaces of the buried metal layer and the WF metal layers, and the lateral surfaces of the HK insulating layer. For this reason, a formation range of the WF metal layer can be arbitrarily set by changing the thicknesses of the offset spacers. Thereby, the gate length can be arbitrarily set using the offset spacers. Therefore, even if the dummy gate electrodes are formed with the same pattern in the lithography process, it is possible to configure the semiconductor device having the optimized gate length in each region.

4. Manufacturing Method of Semiconductor Device According to Second Embodiment Next, a manufacturing method of the semiconductor device according to the second embodiment will be described.

A manufacturing method of the semiconductor device according to the second embodiment can be performed similarly up to the removal process of the dummy gate electrodes shown in FIG. 3B in the manufacturing method of the semiconductor device according to the first embodiment. Therefore, a manufacturing method after the dummy gate electrodes are removed will be described below.

Formation of HK Insulating Layer

Figure 6A:
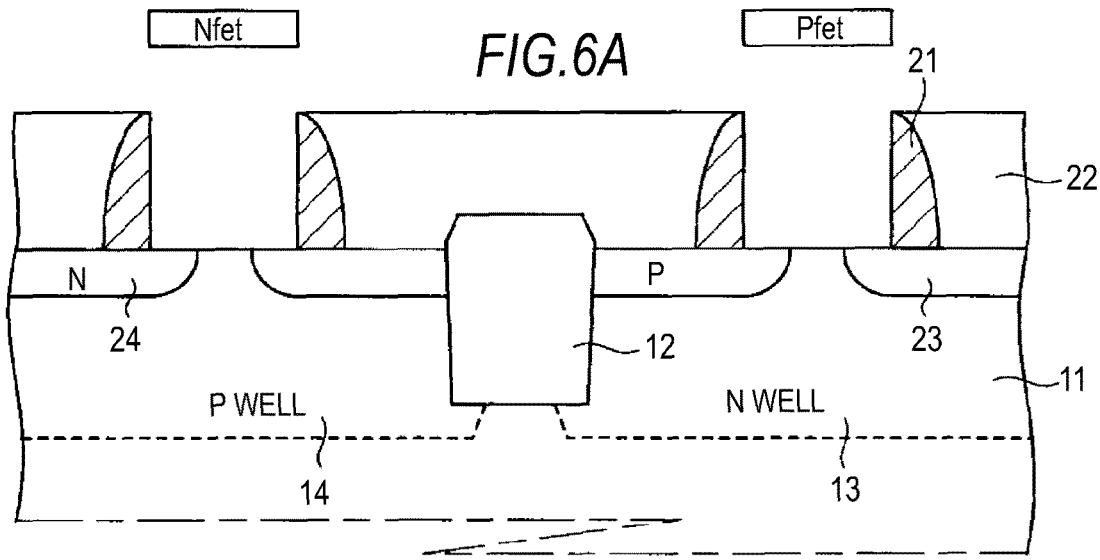
FIGS. 6A to 6C are diagrams illustrating a manufacturing process of the semiconductor device according to the second embodiment.

As shown in FIG. 6A, the semiconductor base 11 is provided in which the grooves are formed in the inner walls of the side wall spacers 21 after the dummy gate electrodes are removed, and the interlayer insulating layer 22, the sources/drains 23 and 24, the N well region 13, and the P well region 14 are formed.

Figure 6B:
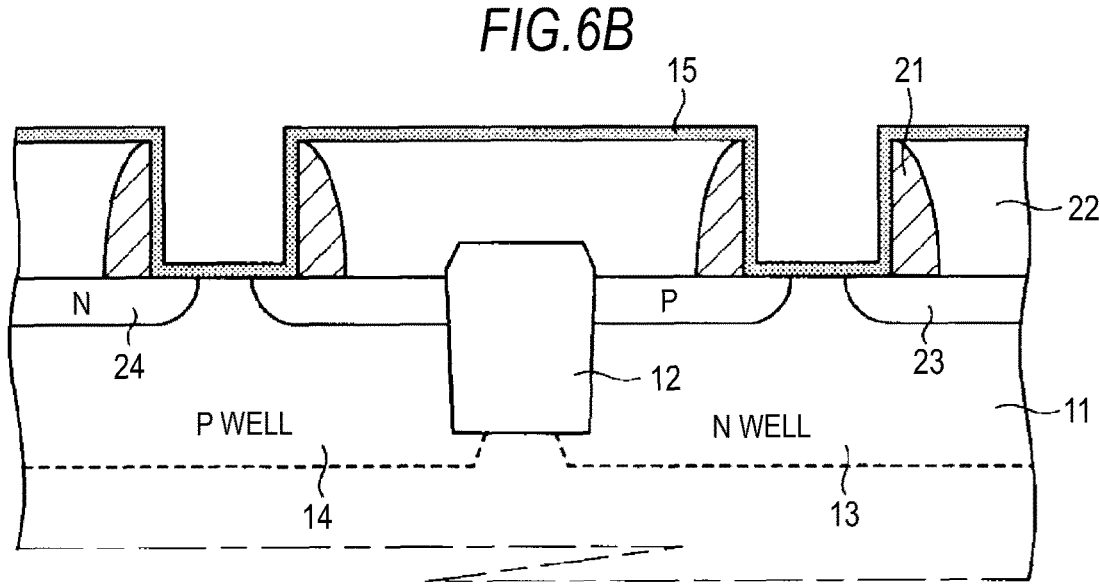

Next, as shown in FIG. 6B, the HK insulating layer 15 is formed over the entire surface of the semiconductor base 11 including the inner wall sides of the side wall spacers 21, and the interlayer insulating layer 22 in the Nfet region and the Pfet region.

The HK insulating layer 15 is formed using an ALD (Atomic Layer Deposition) method or the like. The HK insulating layer 15 is formed using, for example, HfO, HfSiO, LaO, ZrO, ZrSiO, TaO, TiO, BaSrTiO, BaTiO, StTiO, YO, AlO, PbScTaO, and the like. In addition, there are cases where $SiO_2$ is formed for a ground of the HK insulating layer 15 as the gate insulating film. In this case, the $SiO_2$ is removed through plasma oxidation.

Formation of Offset Spacer

Figure 6C:
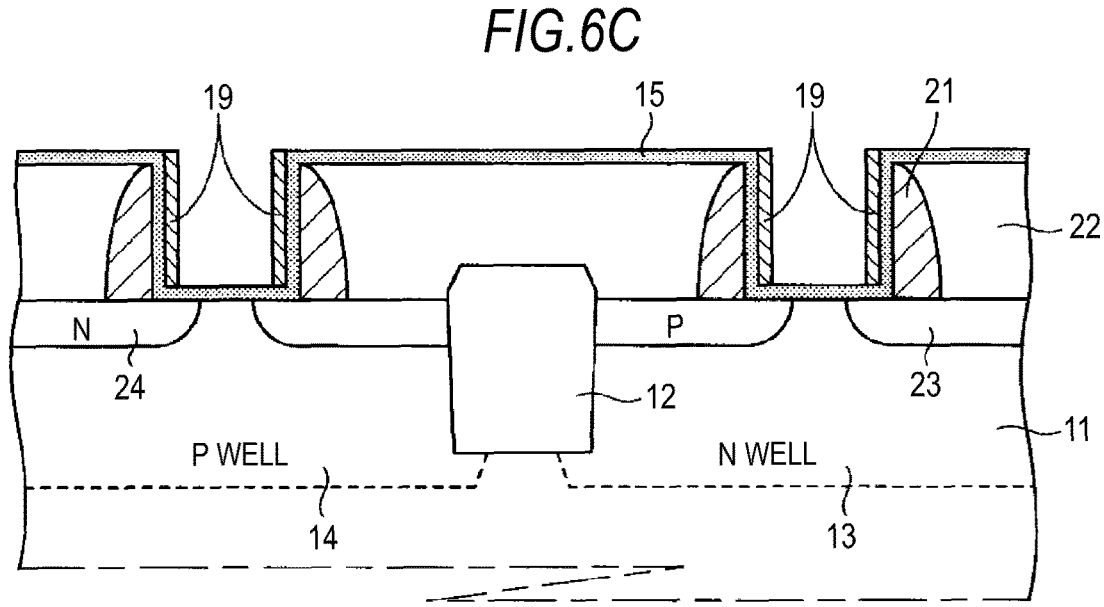

First, an offset spacer material is formed in a range of 1 to 20 nm on the entire surface of the HK insulating layer 15. In addition, as shown in FIG. 6C, the offset spacer material layer is etched back through anisotropic etching so as to form the offset spacers 19 only at the inner walls of the grooves from which the dummy gate electrodes are removed. Here, the offset spacers 19 are formed at the inner walls of the grooves from which the dummy gate electrodes are removed, in both of the Nfet region and the Pfet region. The offset spacer material uses SiN, $SiO_2$, or the like.

Formation of WF Metal Layer

After the offset spacers 19 are formed in both the regions of the Nfet region and the Pfet region or in one region, the Pfet WF (Work Function) metal layer 16 is formed.

Figure 7A:
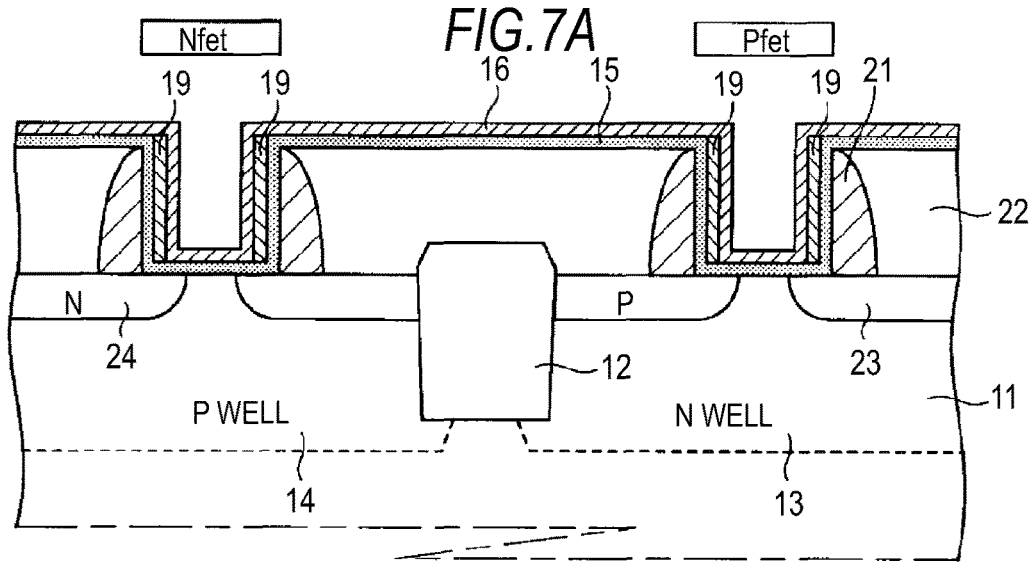
FIGS. 7A to 7C are diagrams illustrating the manufacturing process of the semiconductor device according to the second embodiment.

As shown in FIG. 7A, the Pfet WF metal layer 16 is formed in a range of 1 to 20 nm on the HK insulating layer 15 over the entire surface of the semiconductor base 11, using a CVD method, a PVD method, or an ALD method. The Pfet WF metal layer 16 has 5.2 eV as the optimal work function, and a material close to this value is used. For example, alloys including Ru, Pd, Pt, Co, Ni, and Mo, or an oxide, TiN and the like are used.

Next, the Pfet WF metal layer 16 is removed from the Nfet region by the dry etching method or the wet etching method. At this time, the HK insulating layer 15 in the Nfet region is not removed but is left. For example, a resist pattern or the like is formed on the part where the Pfet WF metal layer 16 is left in the Pfet region, and the Pfet WF metal layer 16 in the Nfet region is etched using the resist pattern as a mask. In a case where TiN is formed as the Pfet WF metal layer 16, the Pfet WF metal layer 16 is removed from the Nfet region using, for example, ammonia hydrogen peroxide.

After the Pfet WF metal layer 16 is removed from the Nfet region, the offset spacers 19 formed at the inner walls of the grooves from which the dummy gate electrodes are removed are removed from the Nfet region. For example, the offset spacers 19 formed in the Nfet region are removed using the Pfet WF metal layer 16 as a mask by a wet etching method using an HF solution. Thereby, the offset spacers 19 are removed from the Nfet region without addition of a process such as lithography where a pattern mask is formed, and thus the offset spacers 19 can be left only in the Pfet region.

Figure 7B:
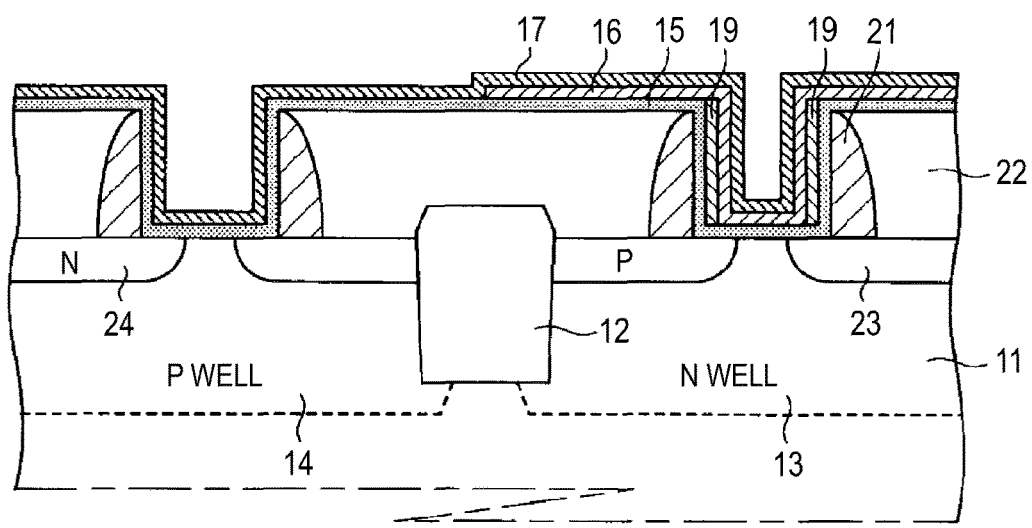

Next, as shown in FIG. 7B, the Nfet WF metal layer 17 is formed in a range of 1 to 20 nm on the Pfet WF metal layer 16 and the HK insulating layer 15, using a CVD method, a PVD method, or an ALD method.

The Nfet WF metal layer 17 has 4.0 eV as the optimal work function, and a material close to this value is used. For example, alloys including Hf, Zr, Ti, Ta, and Al, or a carbide, HfSi, and the like are used.

Burying of Gate Metal

Figure 7C:
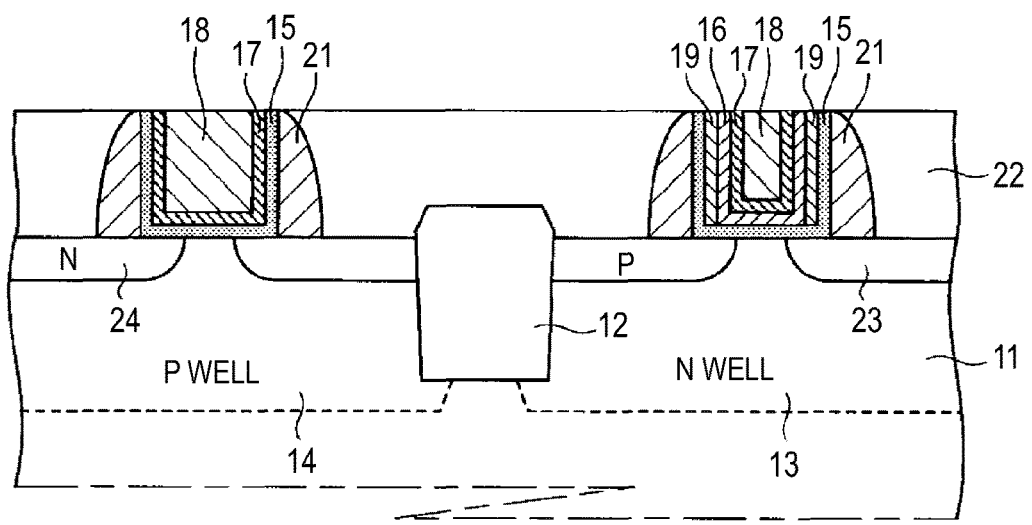

After the Pfet WF metal layer 16 and the Nfet WF metal layer 17 are formed, as shown in FIG. 7C, a low resistance gate material is buried in the grooves from where the dummy gates are removed, thereby forming the buried metal layers

18. As the low resistance gate material, for example, Ti, Al, Cu, and W, or alloys including the metals are used.

As described above, after the dummy gate electrodes are removed, the HK insulating layer 15, the offset spacers 19, the Pfet WF metal layer 16, the Nfet WF metal layer 17, and the low resistance gate material buried in the grooves are formed, thereby obtaining the buried metal layer 18. In addition, planarization is performed by removing the low resistance gate layer, the Nfet WF metal layer 17, the Pfet WF metal layer 16, and the HK insulating layer 15 on the interlayer insulating layer 22 using a CMP method.

The low resistance gate material is left only in the grooves from which the dummy gate electrodes are removed through this process, thereby forming the buried metal layers 18. In addition, in this process, the Nfet WF metal layer 17, the Pfet WF metal layer 16, and the buried metal layer 18 form a metal gate electrode.

Through the above-described processes, the semiconductor device 20 shown in FIG. 5 can be manufactured. In this manufacturing method, the removal of the offset spacers from the Pfet region can be performed subsequent to the removal of the Pfet WF metal layer. For this reason, it is not necessary to perform a lithography process for removing the offset spacers 19 from the Nfet region, and thus a semiconductor device can be manufactured through a simple manufacturing process as compared with the manufacturing method according to the first embodiment.

5. Semiconductor Device According to Third Embodiment

Figure 8:
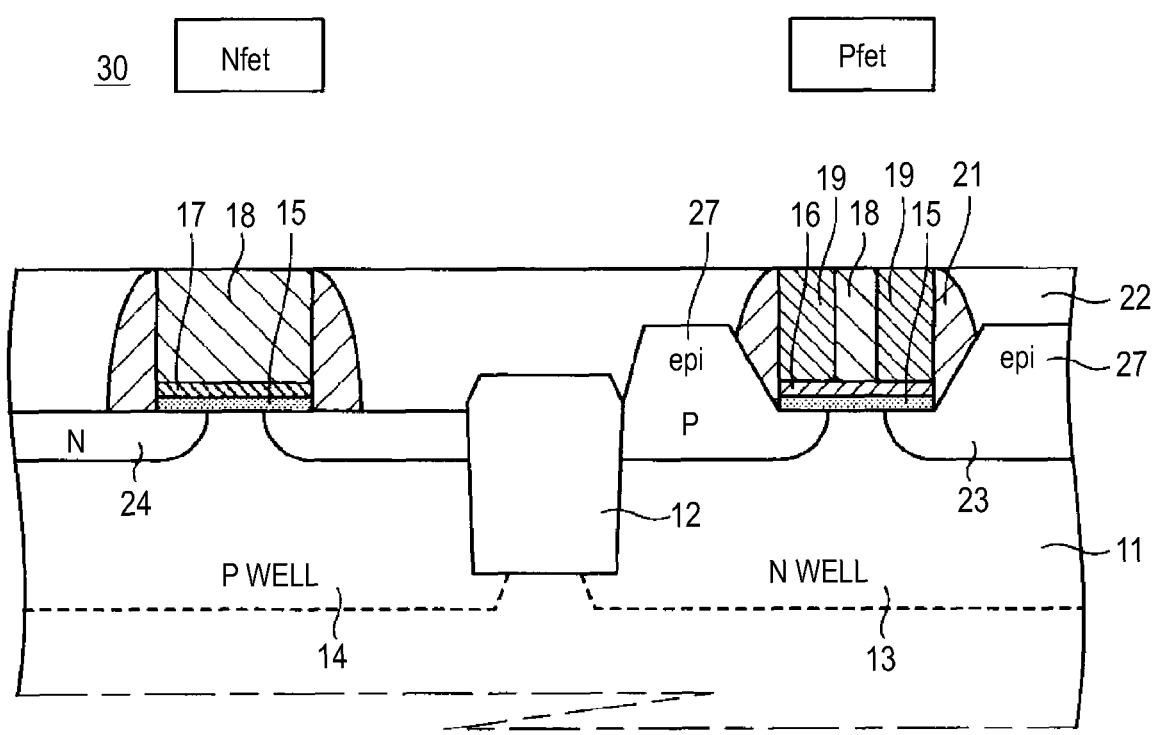
FIG. 8 is a diagram illustrating a configuration of a semiconductor device according to a third embodiment of the present disclosure.

FIG. 8 is a schematic configuration diagram of a semiconductor device according to the second embodiment. In the semiconductor device 30 shown in FIG. 8, the constituent elements which are the same as those of the semiconductor device 10 according to the first embodiment shown in FIG. 1 described above are given the same reference numerals, and description thereof will be omitted.

The semiconductor device 30 shown in FIG. 8 is provided with an element separation 12 made of silicon oxide or the like, which partitions active regions, on a semiconductor base 11 formed from, for example, a silicon substrate or the like. In addition, an N well region 13 is formed in the active region of the PMOS region, and a P well region 14 is formed in the active region of the NMOS region.

In the Nfet region, a buried metal layer 18 is formed via an HK insulating layer 15 and an Nfet WF (Work Function) metal layer 17 on the semiconductor base 11. In addition, in the Pfet region, a buried metal layer 18 is formed via an HK insulating layer 15 and a Pfet WF metal layer 16 on the semiconductor base 11.

The semiconductor device 30 has a metal gate electrode formed of the Pfet WF metal layer 16 or the Nfet WF metal layer 17 and the buried metal layer 18.

The HK insulating layer 15 is a high-k insulating layer having the dielectric constant higher than silicon oxide. As the high-k layer, HfO, HfSiO, LaO, ZrO, ZrSiO, TaO, TiO, BaSrTiO, BaTiO, StTiO, YO, AlO, PbScTaO, and the like may be used. In addition, the HK insulating layer 15 and the silicon oxide film may form the gate insulating film together.

The buried metal layer 18 is made of a pure metal material, an alloy or a metal compound, and, for example, is made of Ti, Al, Cu, and W, or alloys including the metals.

In the Nfet region and the Pfet region, side wall spacers 21 are formed at the side walls of the buried metal layers 18. In addition, in the Pfet region, offset spacers 19 are formed between the HK insulating layer 15 and the Pfet WF metal layer 16 at the side walls of the buried metal layers 18. The side wall spacers 21 are made of SiN, SiO$_2$, or the like, and are formed of a single layer or a plurality of layers. In addition, SiN, SiO$_2$, or the like is used for the offset spacers 19.

In the Nfet region, source/drain 24 which is an n type impurity diffusion region is formed in the semiconductor base 11 which is located directly under the side wall spacers 21 at both sides of the buried metal layer 18. In addition, in the Pfet region, a raised source/drain portion 27 which is formed of epitaxial layers and source/drain 23 which is a P type impurity diffusion region are formed directly under the side wall spacers 21 at both sides of the buried metal layer 18. The sources/drains 23 and 24 have LDDs and halo (not shown) formed therein.

In addition, the surface layers of the sources/drains 23 and 24 and the raised source/drain portion 27 exposed from the side wall spacers 21 become silicide. The silicide is formed from, for example, a cobalt silicide, a nickel silicide, a platinum silicide, or the like.

In the Nfet region of the semiconductor device 30 according to the third embodiment, the HK insulating layer 15 and the Nfet WF metal layer 17 are formed only on the bottom of the buried metal layer 18. In addition, in the Pfet region, the HK insulating layer 15 and the Pfet WF metal layer 16 are formed only on the bottom of the buried metal layer 18. Further, the offset spacers 19 are formed between the metal gate electrodes and the side wall spacers 21 on the HK insulating layer 15 and the Pfet WF metal layer 16.

Since the offset spacers 19 are formed on the Pfet WF metal layer 16 in the Pfet region of the semiconductor device 30 according to the third embodiment, it has no influence on a formation range of the Pfet WF metal layer 16. For this reason, it is difficult to adjust the gate length through the formation of the offset spacers 19. However, it is possible to reduce gate side wall fringing capacitance by forming a reverse T-shaped gate formed of the Pfet WF metal layer 16 and the metal gate electrode. This can improve an increase in capacitance between the gate diffusion layers, particularly, in a recent stress technique, for example, in a case of applying embedded SiGe to a PMOS and of applying embedded SiC to an NMOS.

6. Manufacturing Method of Semiconductor Device According to Third Embodiment Next, a manufacturing method of the semiconductor device according to the third embodiment will be described.

Formation of Element Separation

Figure 9A:
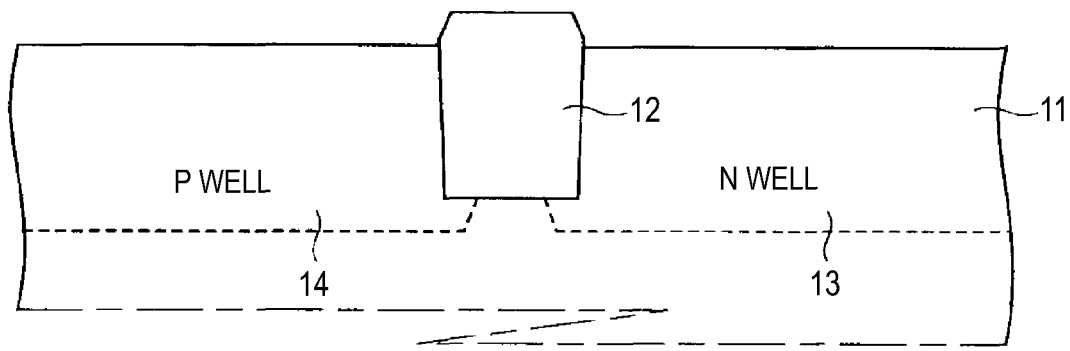
FIGS. 9A to 9C are diagrams illustrating a manufacturing process of the semiconductor device according to the third embodiment.

First, as shown in FIG. 9A, the element separation 12 which partitions the N well region 13 and the P well region 14 is formed in the semiconductor base 11. This may be performed in the same manner as the formation process of the element separation shown in FIG. 2A.

Formation of HK Insulating Layer, WF Metal and Dummy Gate Electrode

First, the sacrificial oxide film which is provided on the semiconductor base 11 when the active region is formed is separated therefrom with a hydrogen fluoride (HF) solution. After the separation, the HK insulating layer is formed using an ALD (Atomic Layer Deposition) method or like. The HK insulating layer 15 is formed using HfO, HfSiO, LaO, ZrO, ZrSiO, TaO, TiO, BaSrTiO, BaTiO, StTiO, YO, AlO, PbScTaO, and the like. In addition, there are cases where a ground of the HK insulating layer 15 mainly includes $SiO_2$. In this case, the $SiO_2$ is formed through plasma oxidation.

Next, WF (Work Function) metal layers are formed on the HK insulating layer 15. A single metal electrode or separate metal electrodes are formed in the NMOS and the PMOS using the WF metal layers. Here, a case where different types of WF metal layers are formed in the NMOS and the PMOS will be described below.

In the Nfet region, the Nfet WF metal layer 17 is formed on the HK insulating layer 15. In addition, in the Pfet region, the Pfet WF metal layer 16 is formed on the HK insulating layer 15.

The Pfet WF metal layer 16 and the Nfet WF metal layer 17 are formed in a range of 1 to 20 nm using TiN, by a CVD method, a PVD method, or an ALD method. The Pfet WF metal layer 16 has 5.2 eV as the optimal work function, and a material close to this value is used. For example, alloys including Ru, Pd, Pt, Co, Ni, and Mo, or an oxide, TiN and the like are used. The Nfet WF metal layer 17 has 4.0 eV as the optimal work function, and a material close to this value is used. For example, alloys including Hf, Zr, Ti, Ta, and Al, or a carbide, HfSi, and the like are used.

Figure 9B:
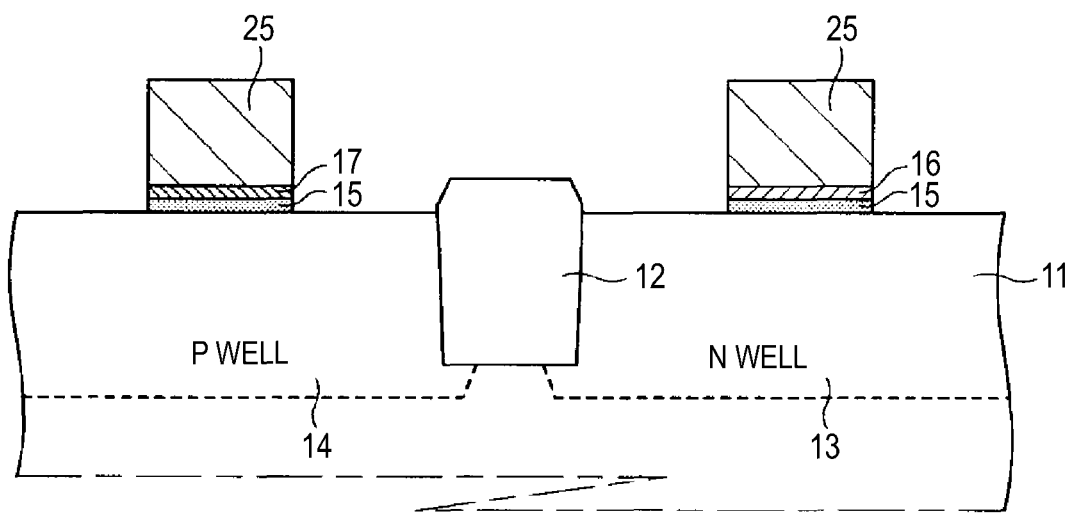

After the Pfet WF metal layer 16 and the Nfet WF metal layer 17 are formed, a dummy gate electrode material layer is formed. The dummy gate electrode material layer is formed on the Pfet WF metal layer 16 and the Nfet WF metal layer 17 by, for example, depositing poly-silicon or amorphous silicon with the thickness of 50 to 100 nm using a CVD method or the like. Next, $Si_3N_4$ is deposited as a hard mask with the thickness of, for example, 50 to 100 nm, using an LP-CVD (Low Pressure-Chemical Vapor Deposition). After the deposition, an electrode pattern is formed on the $Si_3N_4$ hard mask using the lithography process, and then anisotropic etching is performed for the HK insulating layer 15, the Pfet WF metal layer 16, and the Nfet WF metal layer 17, and the dummy gate electrode material layer using the hard mask pattern. The dummy gate electrode material layer is patterned, and thereby the HK insulating layer 15, the Nfet WF metal layer 17, and the dummy gate electrode 25 are formed in the Nfet region of the semiconductor base 11 as shown in FIG. 9B. In addition, the HK insulating layer 15, the Pfet WF metal layer 16, and the dummy gate electrode 25 are formed in the Pfet region of the semiconductor base 11.

Formation of Raised Source/Drain

Figure 9C:
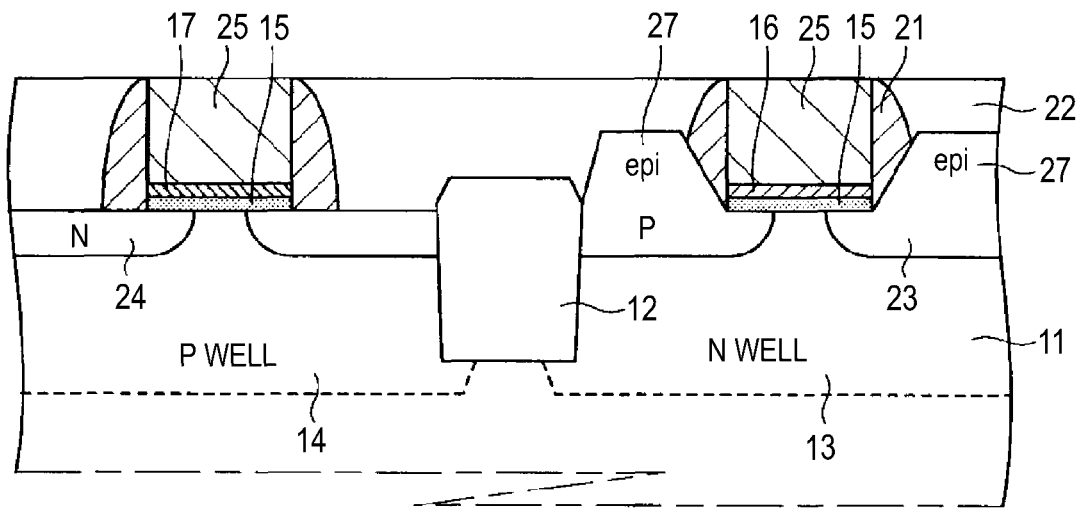

Next, as shown in FIG. 9C, the side wall spacers 21 are formed at the side walls of the dummy gate electrodes 25. In addition, the P type source/drain 23 is formed in the N well region 13, and the N type source/drain 24 and the raised source/drain portion 27 are formed in the P well region 14.

First, the raised source/drain portion 27 is formed in the Pfet region.

In other words, a SiN layer is formed so as to cover the dummy gate electrodes 25 on the semiconductor base 11. Next, a resist pattern which opens the Pfet region is formed. The SiN layer is etched back from the resist opening portion through anisotropic etching, thereby forming dummy side wall spacers at the side walls of the dummy gate electrodes 25.

After the dummy side wall spacers are formed and the semiconductor base 11 of the resist opening portion is etched, SiGe is selectively grown, and thereby an epitaxial growth layer (epi layer) is formed.

After the epi layer made of SiGe is formed, the dummy side wall spacers and the SiN layer remaining at other than the Pfet region are removed so as to form the raised source/drain portion 27.

Formation of Diffusion Region

The ion of $BF_2^+$ is implanted into the PMOS region at 3 to 5 keV and 5 to $20 \times 10^{14}/cm^2$, thereby forming a PLDD region. In addition, the ion of $As^+$ is implanted into the NMOS region at 5 to 10 keV and 5 to $20 \times 10^{14}/cm^2$, thereby forming an NLDD region.

In addition, in order to suppress the short channel effect, so-called halo having impurity concentration higher than the wells is implanted into the sources/drains along with the formation of the LDD. For example, the Nfet region is divided into four regions and undergoes tilt ion implantation using B at 12 keV, $3 \times 10^{13}/cm^2$, and 45°. In addition, the Pfet region is divided into four regions and undergoes tilt ion implantation using As at 70 keV, $2 \times 10^{13}/cm^2$, and 45°.

Formation of Side Wall Spacer

Next, the side wall spacers 21 are formed at the side walls of the dummy gate electrodes 25.

$Si_3N_4$ is deposited with the thickness of 50 to 150 nm on the semiconductor base 11 so as to cover the dummy gate electrodes 25 using the plasma CVD method. Thereafter, anisotropic etching is performed so as to etch back the $Si_3N_4$ layer, thereby forming the side wall spacers 21 at the side walls of the dummy gate electrodes 25. At this time, the $Si_3N_4$ which is a hard mask of the dummy gate electrodes 25 is made to remain.

Formation of Diffusion Region

Next, the ion of $BF_2^+$ is implanted into the N well region 13 at 5 to 10 keV and 1 to $2 \times 10^{15}/cm^2$, thereby forming the P type source/drain 23. The ion implantation of $BF_2^+$ is performed such that a P type region by B is formed in the entire region of the raised source/drain portion 27. In addition, the ion of $As^+$ is implanted into the P well region 14 at 40 to 50 keV and 1 to $2 \times 10^{15}/cm^2$, thereby forming the N type source/drain 24. After the ion implantation, the impurities are activated under the condition of 1000° C. and five seconds using the RTA (Rapid Thermal Annealing), thereby forming a MOSFET shown in FIG. 9C.

After the MOSFET is formed, resistance of the sources/drains 23 and 24 is reduced using a so-called SALICIDE (Self-Aligned siLICIDE) technique. For example, Ni is deposited with the thickness of 6 to 8 nm on the semiconductor base 11 through sputtering. The RTA is performed under the condition of 300 to 500° C. and ten seconds, and thereby silicide (NiSi) is formed only on Si of the sources/drains 23 and 24. After the silicide is formed, unreacted Ni is removed by a chemical solution such as $H_2SO_4/H_2O_2$.

Next, SiN is formed with the thickness of 10 to 100 nm as a contact etching stopper (not shown). Two kinds of SiN may be formed separately so as to apply different mechanical stresses to the NMOS and the PMOS in the transistor.

In addition, $SiO_2$ is deposited with the thickness of 100 to 1000 nm as the interlayer insulating layer 22 on the semiconductor base 11 so as to cover the dummy gate electrodes 25, the side wall spacers 21, and the raised source/drain portions 27. Further, the upper parts of the dummy gate electrodes 25 are exposed through planarization using the CMP method.

Removal of Dummy Gate Electrode

Figure 10A:
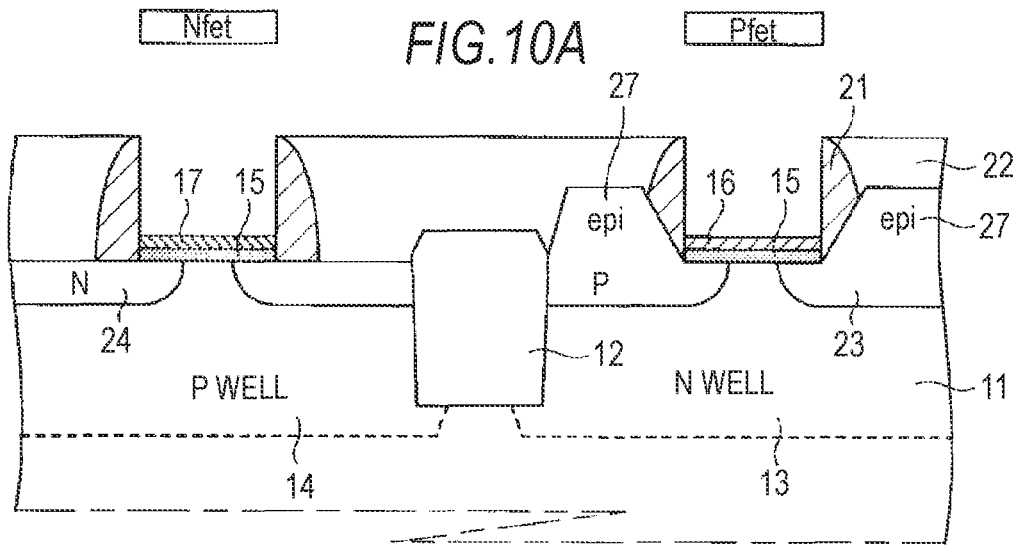
FIGS. 10A to 10C are diagrams illustrating the manufacturing process of the semiconductor device according to the third embodiment.

Next, as shown in FIG. 10A, the dummy gate electrodes 25 are removed so as to open the insides of the side wall spacers 21. In a case where the dummy gate electrodes 25 are made of poly-silicon or amorphous silicon, the dummy gate electrodes 25 are removed by a dry etching method, or a wet etching method using TMAH (Tetra methyl ammonium hydroxide).

Formation of Offset Spacer

Figure 10B:
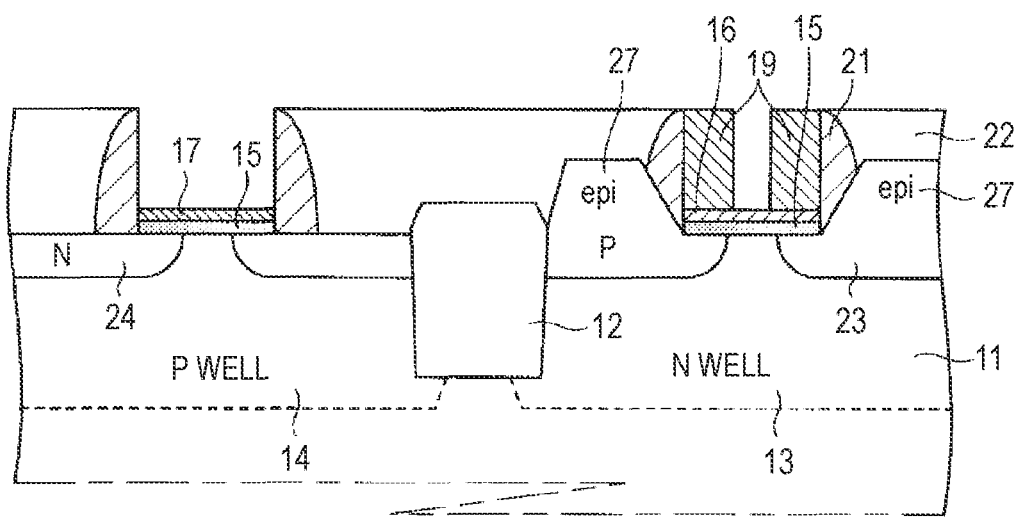

Next, as shown in FIG. 10B, the offset spacers 19 are formed on the Pfet WF metal layer at the inner walls of the side wall spacers 21 in the Pfet region.

The Pfet WF metal layer 16 or the Nfet WF metal layer 17 is present on the bottom of the grooves from which the dummy gate electrodes are removed. An offset spacer material is formed in a range of 1 to 20 nm so as to cover the grooves from which the dummy gate electrodes are removed. In addition, etch-back is performed through anisotropic etching, thereby forming the offset spacers at the inner walls of the grooves from which the dummy gate electrodes are removed. As a material of the offset spacers, SiN, SiO$_2$, or the like is used.

Thereafter, the offset spacers are removed from the Nfet region by a wet etching method using an HF solution.

Burying of Gate Metal

Figure 10C:
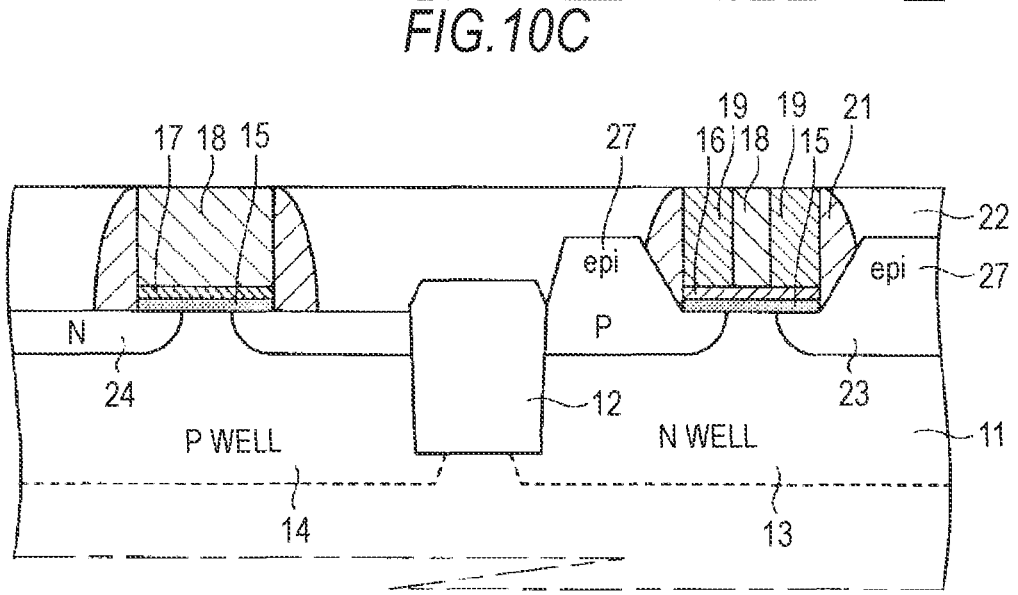

After the offset spacers 19 are formed, as shown in FIG. 10C, a low resistance gate material is buried in the grooves from which the dummy gate electrodes are removed, thereby forming the buried metal layers 18. As the low resistance gate material, for example, Ti, Al, Cu, and W, or alloys including the metals are used.

After the offset spacers 19 are formed in the grooves from which the dummy gate electrodes are removed, the low resistance gate material is buried therein so as to form the low resistance gate material layer on the Pfet WF metal layer 16 or the Nfet WF metal layer 17, thereby obtaining the buried metal layer 18. In addition, planarization is performed by removing the low resistance gate layer on the interlayer insulating layer 22 using the CMP method. Through this process, the low resistance gate material is left only in the grooves from which the dummy gate electrodes are removed, thereby forming the buried metal layer 18.

Through the above-described processes, the semiconductor device 30 shown in FIG. 8 can be manufactured. According to the manufacturing method, the Pfet WF metal layer 16 is formed in the grooves from which the dummy gate electrodes are removed earlier than the offset spacers 19. For this reason, an object of forming the offset spacers 19 is not to adjust the gate length but to reduce the gate side wall fringing capacitance. Since the offset spacers 19 are formed between the metal gate electrode and the side wall spacers 21, the metal gate electrode is formed so as to have the area smaller than the Pfet WF metal layer 16, and thus the reverse T-shaped gate is formed by the Pfet WF metal layer 16 and the metal gate electrode. This formation of the reverse T-shaped gate can improve an increase in capacitance between the gate diffusion layers, particularly, in a recent stress technique, for example, in a case of applying embedded SiGe to a PMOS and of applying embedded SiC to an NMOS.

7. Semiconductor Device According to Fourth Embodiment

Figure 11A:
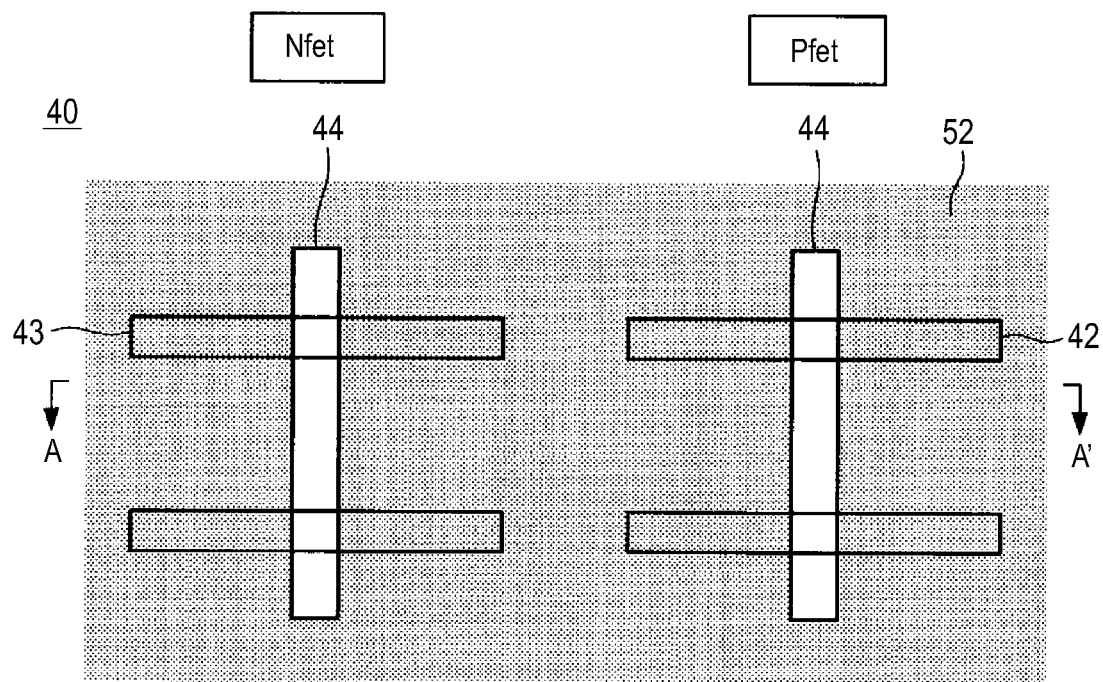
FIG. 11A is a plan view illustrating a configuration of a semiconductor device according to a fourth embodiment of the present disclosure.
Figure 11B:
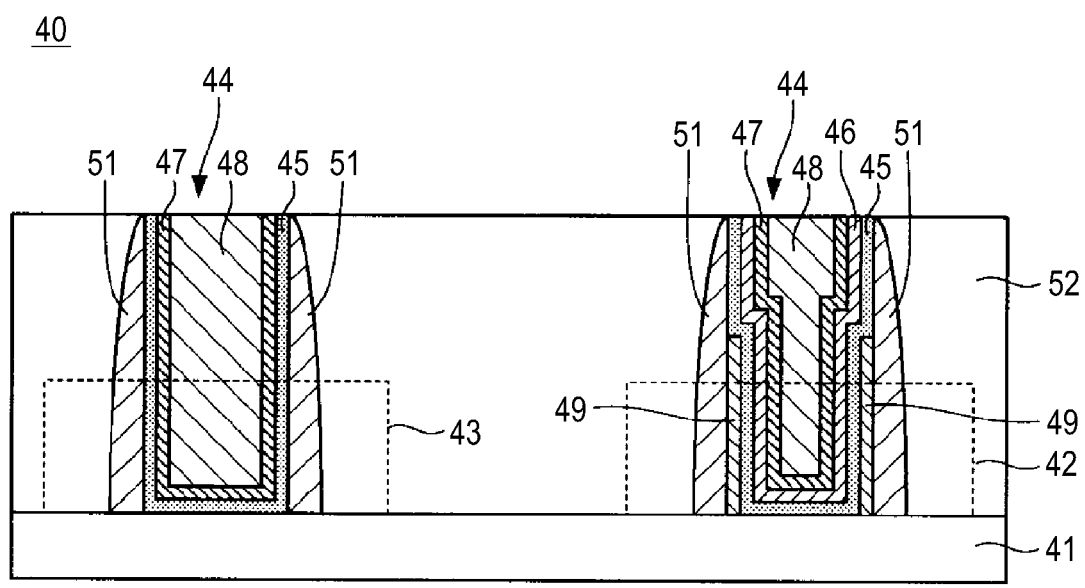
FIG. 11B is a cross-sectional view illustrating the semiconductor device according to the fourth embodiment of the present disclosure.

FIGS. 11A and 11B are schematic configuration diagrams of a semiconductor device according to the fourth embodiment. FIG. 11A is a plan view of the semiconductor device 40 according to the fourth embodiment, and FIG. 11B is a cross-sectional view of the semiconductor device taken along the line A-A' in FIG. 11A. The semiconductor device 40 shown in FIGS. 11A and 11B includes an Nfet region and a Pfet region having a fin structure. In addition, the semiconductor device 40 has a configuration where offset spacers are formed in one gate electrode. In addition, in the following description, the first conductivity type of the semiconductor device is a P type, and the second conductivity type thereof is an N type.

In the semiconductor device 40 shown in FIG. 11A, thin semiconductor layers (fins) 42 and 43 are respectively formed so as to rise in the Pfet region and the Nfet region. In addition, the channel regions of the fin 42 and the fin 43 are covered with gate electrodes 44. In this way, a fin type field effect transistor (finFET) having a configuration where the gate electrodes 44 are inserted into the channel regions of the fins 42 and 43 from both sides of left and right. For example, an oxide insulating layer 41 is formed on a semiconductor base formed from a silicon substrate (not shown), and the thin semiconductor layers (fins) 42 and 43 rising from the oxide insulating layer 41 are formed. In addition, the fin 42 of the Pfet region has a source/drain where a P type impurity is diffused, and the fin 43 of the Nfet region has a source/drain where an N type impurity is diffused.

Next, a structure of the gate electrodes 44 of the semiconductor device 40 shown in FIG. 11B will be described.

The gate electrodes 44 are formed in the U shape so as to cover the channel regions of the above-described fins 42 and 43 from one side to the other side. The configurations of the gate electrodes of the semiconductor device 40 are different in the Pfet region and the Nfet region.

In the Pfet region, a buried metal layer 48 is formed via an HK insulating layer 45, a Pfet WF metal layer 46, and an Nfet WF metal layer 47 on the oxide insulating layer 41. In addition, in the Nfet region, a buried metal layer 48 is formed via an HK insulating layer 45 and an Nfet WF (Work Function) metal layer 47 on the oxide insulating layer 41.

The semiconductor device 40 has a metal gate electrode 44 formed of the Pfet WF metal layer 46 or the Nfet WF metal layer 47 and the buried metal layer 48.

The HK insulating layer 45 is a high-k insulating layer having the dielectric constant higher than silicon oxide. As the high-k layer, HfO, HfSiO, LaO, ZrO, ZrSiO, TaO, TiO, BaSrTiO, BaTiO, StTiO, YO, AlO, PbScTaO, and the like may be used. In addition, the HK insulating layer 45 and the silicon oxide film may form the gate insulating film together.

The buried metal layer 48 is made of a pure metal material, an alloy or a metal compound, and, for example, is made of Ti, Al, Cu, and W, or alloys including the metals.

In the Nfet region and the Pfet region, side wall spacers 51 are formed at the side walls of the buried metal layers 48. In addition, in the Pfet region, offset spacers 49 are formed at the lower parts of the inner walls of the HK insulating layer 45 and the side wall spacers 51. For this reason, the Pfet region has a multi-layer body formed of the offset spacers 49, the HK insulating layer 45, the Pfet WF metal layer 46, and the Nfet WF metal layer 47 from the inner walls of the side wall spacers 51. Further, the buried metal layer 48 is formed at the inside surrounded by the multi-layer body.

The side wall spacers 51 are made of SiN, $SiO_2$, or the like, and are formed of a single layer or a plurality of layers. In addition, SiN, $SiO_2$, or the like is used for the offset spacers 49.

The offset spacers 49 are formed only at the lower parts of the inner walls of the side wall spacers 51. In addition, the offset spacers 49 are formed up to positions higher than the upper part of the fin 42. Therefore, in the part where the fin 42 is formed, the HK insulating layer 45, the Pfet WF metal layer 46, and the side wall spacers 51 are connected to the fin 42 only via the offset spacers 49.

The sizes of the opening portions of the side wall spacers are determined by patterning the gate electrodes in the lithography process, and thus the same pattern is preferable.

This is because patterning is desired to be designed with regularity so as to be constant for ease of manufacturing in a case of processing a fine pattern. In the Nfet region and the Pfet region, opening portions of the side wall spacers are preferably formed with the same size. However, if the opening portions of the side wall spacers are the same as each other in the Nfet region and the Pfet region, the gate length may not be optimized so as to match each diffusion layer profile.

Therefore, the sizes of the opening portions are adjusted by forming the offset spacers 49 inside the opening portions of the side wall spacers. The gate length of the Pfet region can be adjusted by forming the offset spacers 49 between the WF metal layer 46 and the side wall spacers 51. In addition, a range where the Pfet WF metal layer 46 is formed is adjusted using the offset spacers 49 in the opening portion, and thus the gate length can be optimized at an arbitrary length.

In addition, in a case of the fin type semiconductor device, the gate electrode bottom and the gate side wall shape influence the gate length. For this reason, a difference occurs in the gate length in a case where the inner walls of the side wall spacers where the gate electrode is formed are tapered or in a case where roughness is present in the side walls, and thereby optimization is difficult.

On the other hand, in the semiconductor device according to the fourth embodiment, the offset spacers 49 are formed at the inner wall sides of the side wall spacers 51, particularly, between the side wall spacers 51 and the HK insulating layer 45, or between the HK insulating layer 45 and the WF metal layer 46. With this structure, for example, in a case where the roughness is present in the inner walls of the side wall spacers 51, the inner walls of the side wall spacers 51 where the fin 42 is formed can be planarized by the offset spacers 49. In addition, for example, even if the inner walls of the side wall spacers 51 are tapered, the inner walls of the parts where the fin 42 is formed are made to be vertical by forming the offset spacers 49, and thereby the gate length can be adjusted.

In addition, the offset spacers may be formed in both of the Pfet region and the Nfet region as well as being formed only in the Pfet region as shown in FIG. 11B. In this case, each of the gate lengths can be arbitrarily set by changing the thicknesses of the offset spacers in the Pfet region and the Nfet region.

As shown in the semiconductor device according to the above-described fourth embodiment, the gate electrode structure of the semiconductor device having the planar type structure as in the first embodiment or the second embodiment described above is applicable to the semiconductor device having the fin type structure. In addition, the gate length can be optimized by changing the thicknesses of the offset spacers. Therefore, even if the dummy gate electrodes and the side wall spacers are formed with the same pattern in the lithography process, it is possible to configure the semiconductor device having the optimized gate length in each region.

8. Manufacturing Method of Semiconductor Device According to Fourth Embodiment

Next, a manufacturing method of the semiconductor device according to the fourth embodiment will be described. A manufacturing method of the semiconductor device according to the fourth embodiment can be performed by the same processes except that the above-described manufacturing method of the semiconductor device according to the first embodiment is applied to the fin type semiconductor device. Detailed description of the same processes as in the manufacturing method of the semiconductor device according to the first embodiment will be omitted in the following.

Formation of Fin

Figure 12A:
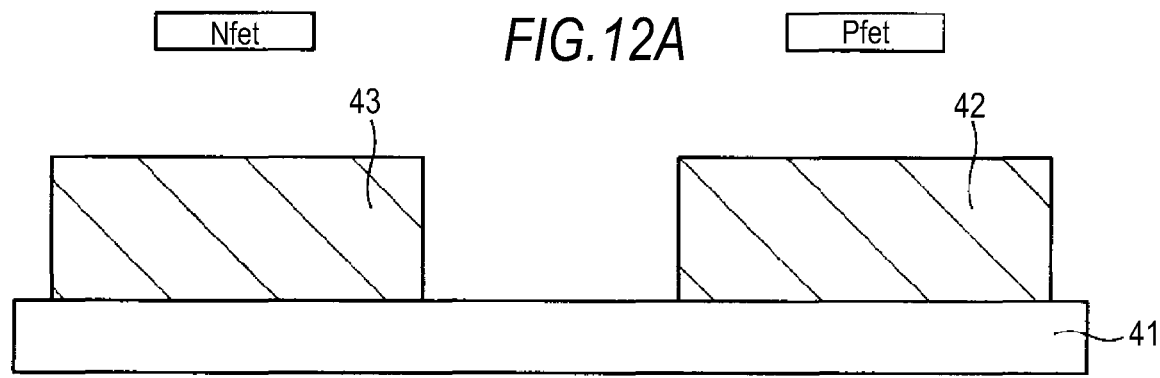
FIGS. 12A to 12C are diagrams illustrating a manufacturing process of the semiconductor device according to the fourth embodiment.

First, as shown in FIG. 12A, the fins 42 and 43 are formed on the oxide insulating layer 41.

The fin 42 is formed in the Pfet region by the well-known method. In addition, the fin 43 is formed in the Nfet region. For example, a semiconductor layer such as silicon is deposited, the ion of a P type impurity or an N type impurity is implanted thereinto so as to form a source/drain, and etching is performed so as to have a predetermined fin shape.

Formation of Dummy Gate

Next, a gate insulating film and a dummy gate electrode are formed in the Nfet region and the Pfet region of the oxide insulating layer 41.

First, a gate insulating film is formed with the thickness of 1 to 3 nm through dry oxidation ($O_2$, 700° C.) on the surfaces of the fins 42 and 43. Next, a dummy gate electrode material layer is formed using the CVD method. The dummy gate electrode material layer is formed on the oxide insulating layer 41 by, for example, depositing poly-silicon or amorphous silicon with the thickness of 50 to 100 nm. After the deposition, a resist pattern is formed using the lithography process, and then anisotropic etching is performed for the dummy gate electrode material layer using the hard mask pattern. The dummy gate electrode material layer is patterned, and thereby the dummy gate electrodes 53 are formed on the oxide insulating layer 41 as shown in FIG. 12A.

Formation of Side Wall Spacer

Next, the side wall spacers 51 are formed at the side walls of the dummy gate electrodes 53.

$Si_3N_4$ is deposited with the thickness of 50 to 150 nm on the oxide insulating layer 41 so as to cover the dummy gate electrodes 53 using a plasma CVD method. Thereafter, anisotropic etching is performed so as to etch back the $Si_3N_4$ layer, thereby forming the side wall spacers 51 at the side walls of the dummy gate electrodes 53.

Figure 12B:
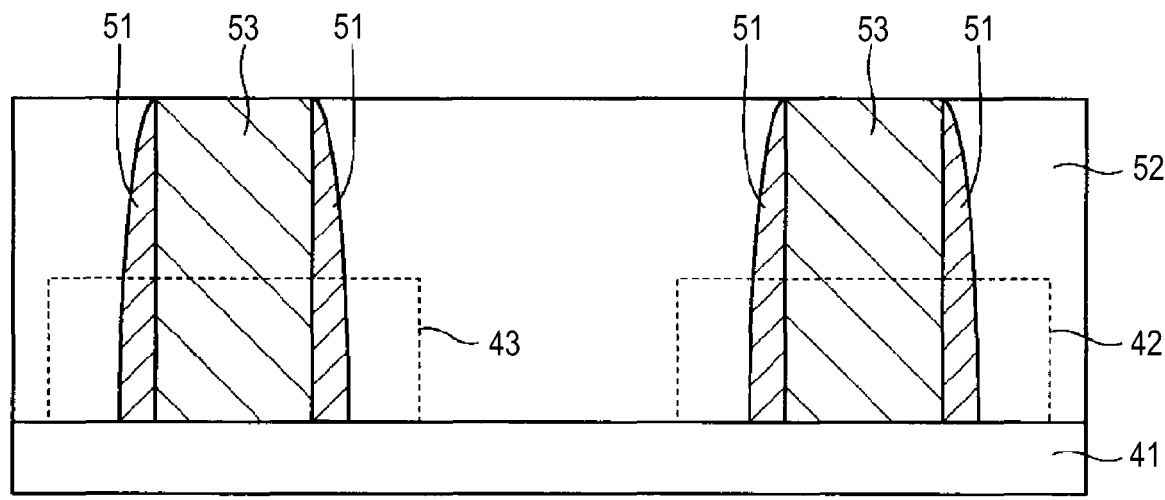

In addition, $SiO_2$ is deposited with the thickness of 100 to 1000 nm as the interlayer insulating layer 52 on the oxide insulating layer 41 so as to cover the dummy gate electrodes 53 and the side wall spacers 51. Further, as shown in FIG. 12B, the upper parts of the dummy gate electrodes 53 are exposed through planarization using a CMP method.

Removal of Dummy Gate

Figure 12C:
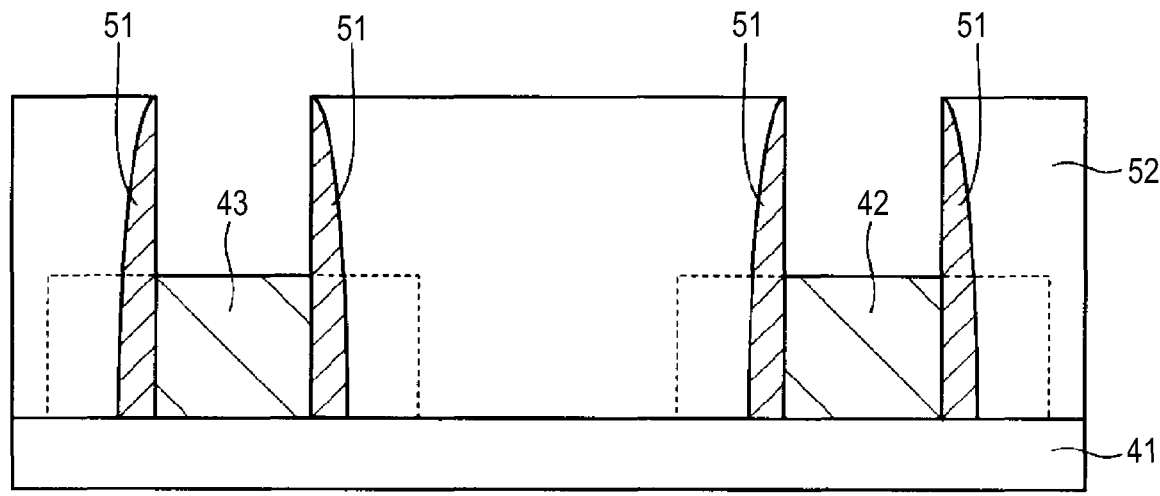

Next, as shown in FIG. 12C, the dummy gate electrodes 53 are removed so as to open the insides of the side wall spacers 51, thereby exposing the fins 42 and 43. In a case where the dummy gate electrodes 53 are made of polysilicon or amorphous silicon, the dummy gate electrodes 53 are removed by a dry etching method, or a wet etching method using TMAH (Tetra Methyl Ammonium Hydroxide). At this time, the $SiO_2$ formed as the gate insulating films under the dummy gate electrodes 53 are also removed by a wet etching method or the like.

Formation of Offset Spacer

Figure 13A:
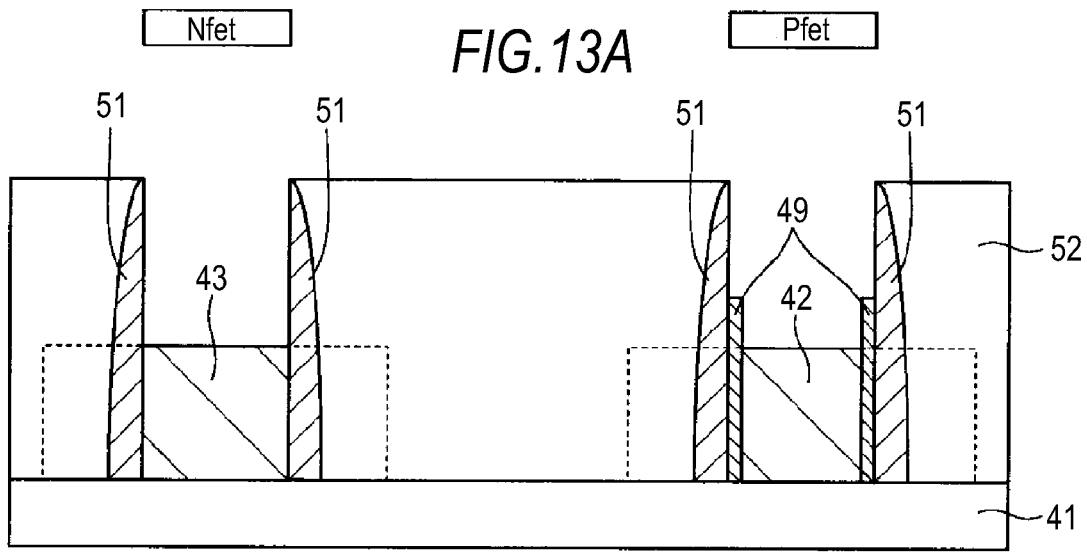
FIGS. 13A to 13C are diagrams illustrating the manufacturing process of the semiconductor device according to the fourth embodiment.

Next, as shown in FIG. 13A, the offset spacers 49 are formed at the inner walls of the side wall spacers 51 in the grooves from which the dummy gate electrodes are removed in the Pfet region.

First, an offset spacer material is formed in a range of 1 to 20 nm over the entire surface of the oxide insulating layer 41, inside the opening portions of the inner walls of the side wall spacers 51, and on the exposed fins 42 and 43. The offset spacer material uses SiN, $SiO_2$, or the like. Further, the offset spacer material layer is etched back through anisotropic etching.

In the etch-back of the offset spacer material layer, over-etching is performed until the offset spacer material layer formed at the side walls of the fins 42 and 43 exposed from the opening portions of the side wall spacers 51 is removed. Through the etching, the offset spacers 49 can be formed only at the inner wall sides of the side wall spacers 51 without remaining at the side walls of the fins 42 and 43.

At this time, it is necessary to form the above-described dummy gate electrodes 53 and side wall spacers 51 so as to be double or more the height of the fins. With being double or more the height of the fins, the offset spacers 49 remain so as to be more than the height at which the fins 42 and 43 are formed in the side wall spacers 51 when the over-etching is performed until the offset spacer material layer formed at the side walls of the fins 42 and 43 are removed.

In addition, in the same manner as the manufacturing method of the semiconductor device according to the first embodiment, the gate insulating layer may be removed after the offset spacers 49 are formed, without removing the gate insulating film in the dummy gate removal process.

After the offset spacers 49 are formed, a resist layer is formed over the entire surface of the oxide insulating layer 41, and a resist pattern for opening the groove from which the dummy gate electrodes are removed in the Nfet region is formed. The offset spacers formed at the inner walls of the side wall spacers 51 in the Nfet region are removed through the wet etching method using an HF solution.

Formation of Hk Insulating Layer

Figure 13B:
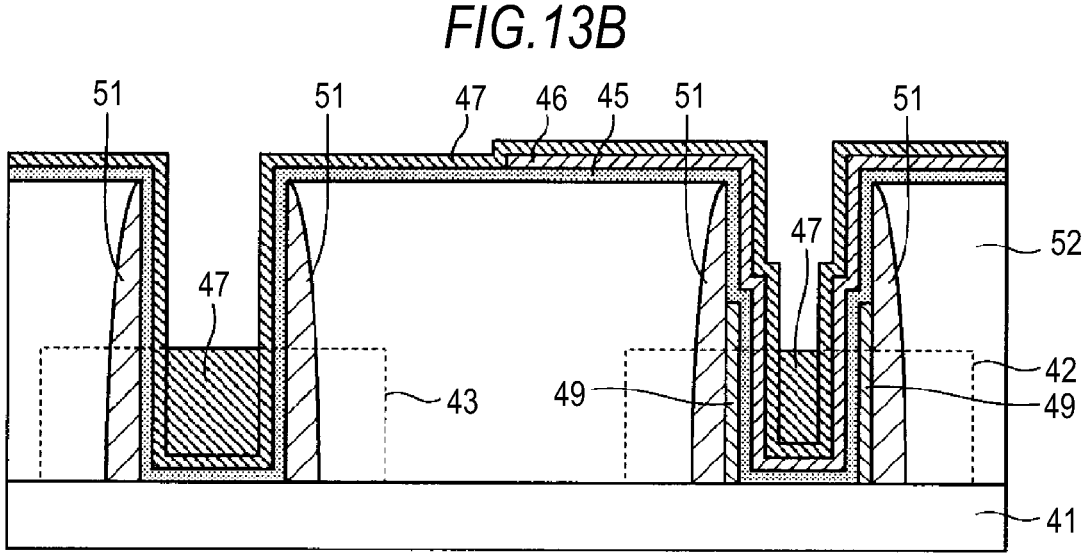

Next, as shown in FIG. 13B, a gate insulating layer is formed using the HK insulating layer 45.

The HK insulating layer 45 is formed over the entire surface of the interlayer insulating layer 52 so as to cover the opening portions of the side wall spacers 51 using an ALD (Atomic Layer Deposition) method or the like. The HK insulating layer 45 is formed using, for example, HfO, HfSiO, LaO, ZrO, ZrSiO, TaO, TiO, BaSrTiO, BaTiO, StTiO, YO, AlO, PbScTaO, and the like.

Formation of WF Metal Layer

After the HK insulating layer 45 is formed, WF (Work Function) metal layers are formed. A single metal electrode or separate metal electrodes are formed in the NMOS and the PMOS using the WF metal layers. Here, a case where different WF metal layers are formed in the NMOS and the PMOS will be described below.

First, the Pfet WF metal layer 46 is formed.

As shown in FIG. 13B, the Pfet WF metal layer 46 is formed in a range of 1 to 20 nm on the HK insulating layer 45 using a CVD method, a PVD method, or an ALD method. The Pfet WF metal layer 46 has 5.2 eV as the optimal work function, and a material close to this value is used. For example, alloys including Ru, Pd, Pt, Co, Ni, and Mo, or an oxide, TiN and the like are used.

Next, the Pfet WF metal layer 46 is removed from the Nfet region by the dry etching method or the wet etching method. At this time, the HK insulating layer 45 in the Nfet region is not removed but is left. For example, a resist pattern is formed on the part where the Pfet WF metal layer 46 is left in the Pfet region, and the Pfet WF metal layer 46 in the Nfet region is etched using the resist pattern as a mask. In a case where TiN is formed as the Pfet WF metal layer 46, the Pfet WF metal layer 46 is removed from the Nfet region using, for example, ammonia hydrogen peroxide.

Next, the Nfet WF metal layer 47 is formed in a range of 1 to 20 nm on the Pfet WF metal layer 46 and the HK insulating layer 45, using a CVD method, a PVD method, or an ALD method. The Nfet WF metal layer 47 has 4.0 eV as the optimal work function, and a material close to this value is used. For example, alloys including Hf, Zr, Ti, Ta, and Al, or a carbide, HfSi, and the like are used.

Burying of Gate Metal

Figure 13C:
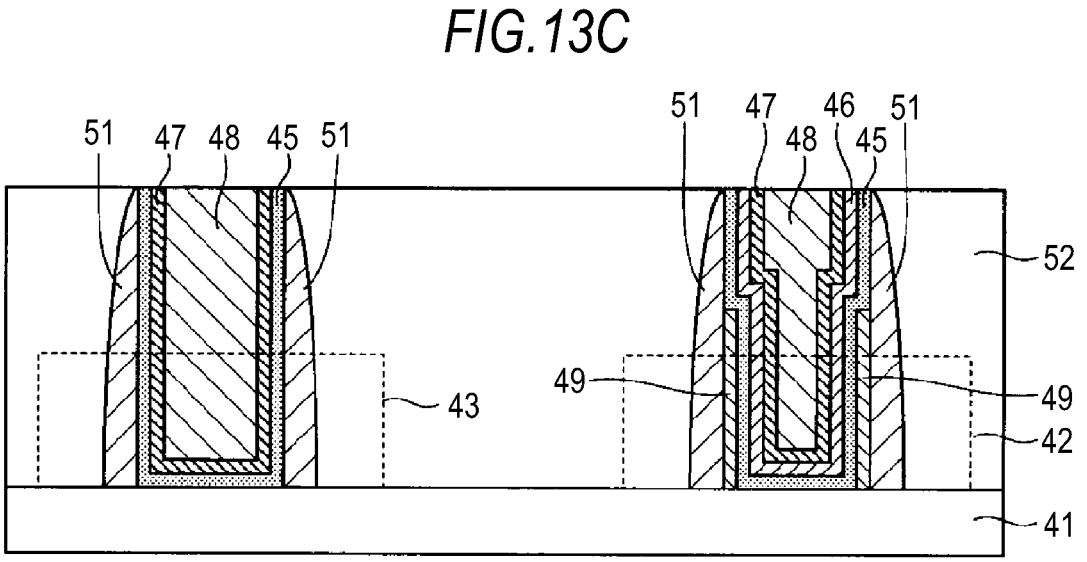
Figure 14:
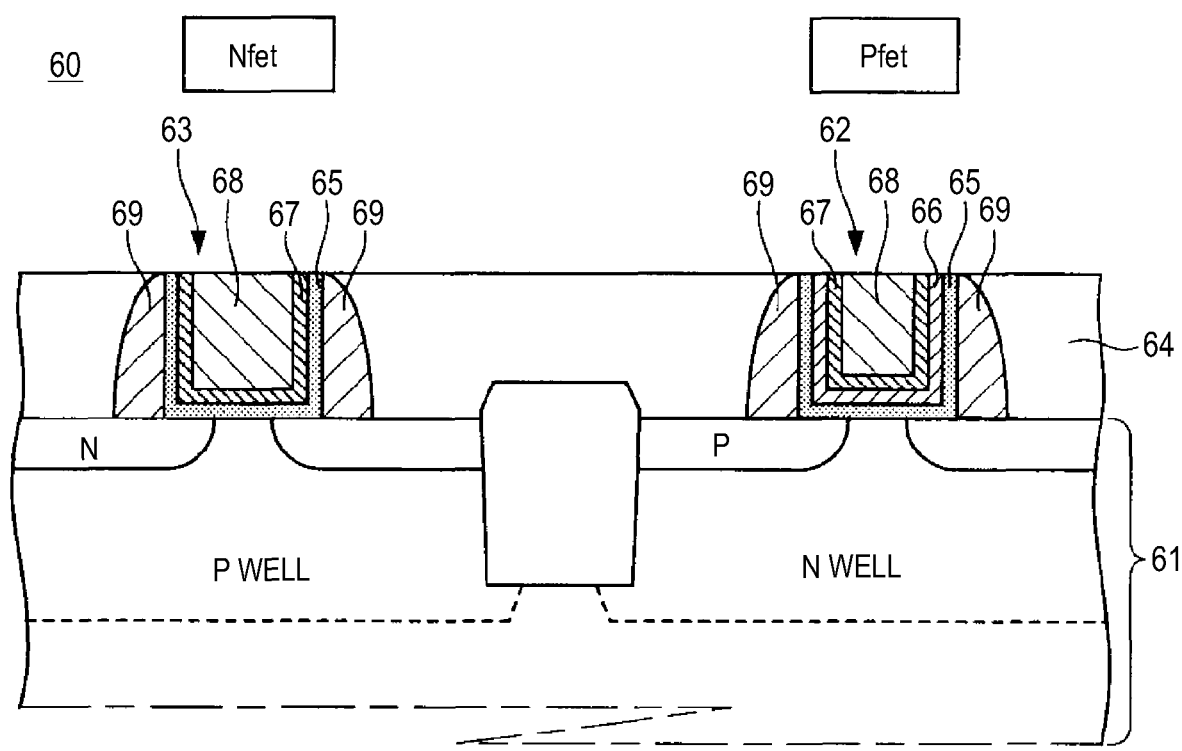
FIG. 14 is a diagram illustrating a structure of a semiconductor device in the related art.
Figure 15A:
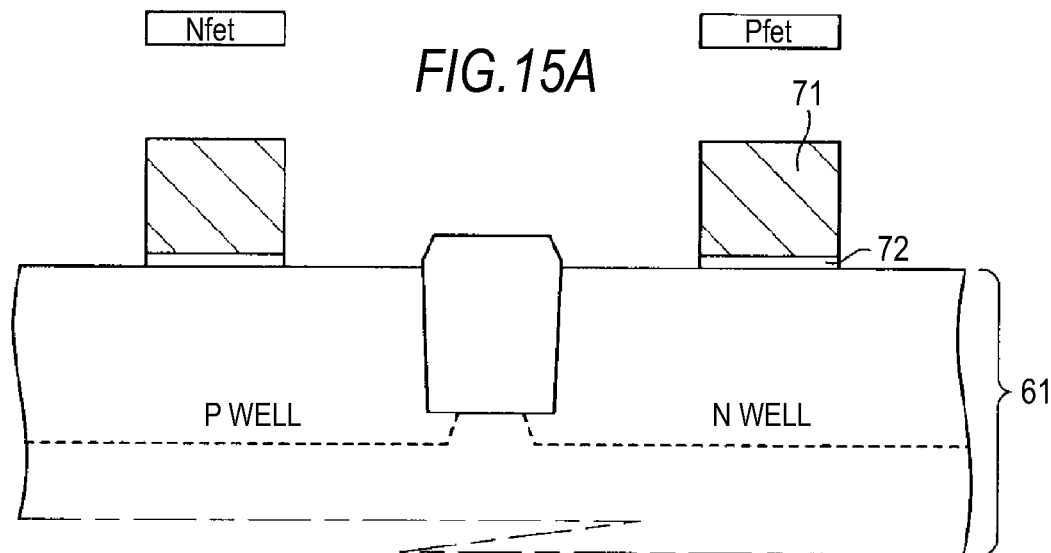
FIGS. 15A to 15C are diagrams illustrating a manufacturing process of the semiconductor device in the related art.
Figure 15B:
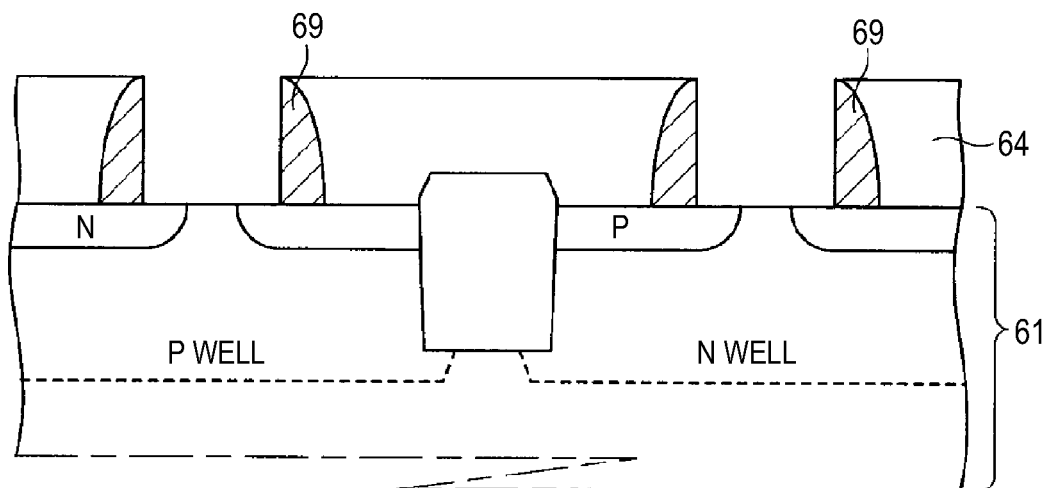
Figure 15C:
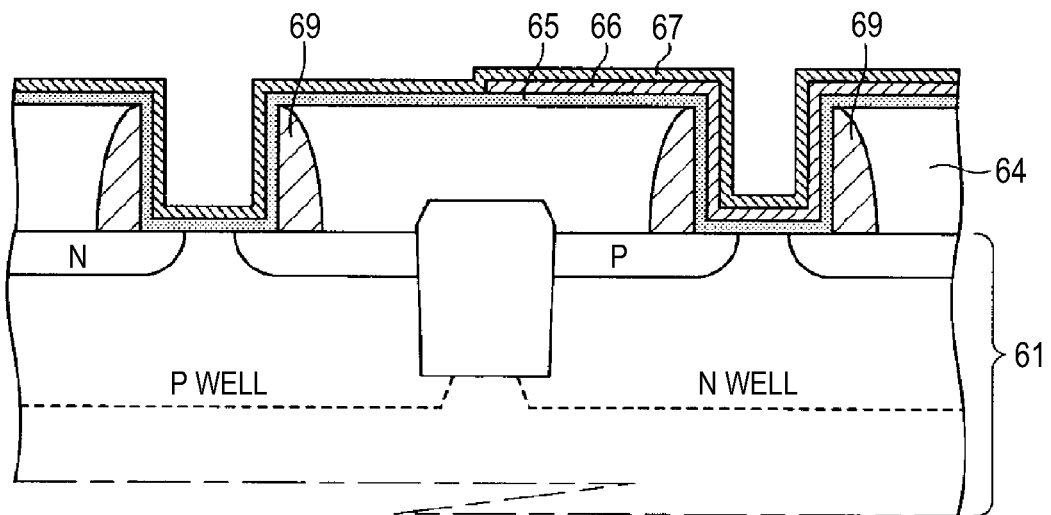

After the Pfet WF metal layer 46 and the Nfet WF metal layer 47 are formed, as shown in FIG. 13C, a low resistance gate material is buried in the grooves from which the dummy gate electrodes are removed, thereby forming the buried metal layers 48. As the low resistance gate material, for example, Ti, Al, Cu, and W, or alloys including the metals are used.

As described above, after the offset spacers 49, the HK insulating layer 45, the Pfet WF metal layer 46, and the Nfet WF metal layer 47 are formed in the grooves from which the dummy gate electrodes are removed, the low resistance gate material is buried therein so as to form the low resistance gate material layer, thereby obtaining the buried metal layer 48. In addition, planarization is performed by removing the low resistance gate layer, the Nfet WF metal layer 47, the Pfet WF metal layer 46, and the HK insulating layer 45 on the interlayer insulating layer 52 using a CMP method.

The low resistance gate material is left only in the grooves from which the dummy gate electrodes are removed through this process, thereby forming the buried metal layers 48. In addition, in this process, the Nfet WF metal layer 47, the Pfet WF metal layer 46, and the HK insulating layer 45 which are continuously formed on the interlayer insulating layer 52 are removed so as to be left only in the grooves when the buried metal layer 48 is formed.

Through the above-described processes, the semiconductor device 40 shown in FIGS. 11A and 11B can be manufactured. According to the manufacturing method, the fin type semiconductor device can be manufactured according to the manufacturing processes which are the same as in the first embodiment by adding the process of forming the fin type semiconductor layer. In addition, it is possible to optimize the gate length by forming the offset spacers between the inner walls of the side wall spacers and the WF metal layer.

Although, in the semiconductor device according to the fourth embodiment, the offset spacers are formed between the inner walls of the side wall spacers and the HK insulating layer in the same manner as the first embodiment, the formation position of the offset spacers is not particularly limited as long as it is located between the inner walls of the side wall spacers and the WF metal layer. For example, the offset spacers may be formed between the HK insulating layer and the WF metal layer in the inner walls of the side wall spacers in the same manner as the semiconductor device according to the second embodiment.

In this case, as described with reference to FIG. 12C, the dummy gate electrodes are removed, and then the HK insulating layers are formed in the grooves from which the dummy gate electrodes are removed. In addition, as described with reference to FIG. 13A, after the offset spacer material layer is formed on the HK insulating layer so as to be double or more the height of the fins, the offset spacer material is etched back, thereby forming the offset spacers only at the inner wall sides of the side wall spacers. Further, as described with reference to FIGS. 13B and 13C, the WF metal layers and the buried metal layers are formed in the grooves. In this way, by applying the manufacturing method of the semiconductor device according to the second embodiment to the manufacturing method of the semiconductor device according to the fourth embodiment, it is possible to manufacture the fin type semiconductor device where the offset spacers are formed between the HK insulating layer and the WF metal layer.

The present disclosure is not limited to the configurations described in the above-described embodiments, and may have various modifications and alterations in the scope not departing from the configurations of the present disclosure.

The present disclosure contains subject matter related to that disclosed in Japanese Priority Patent Application JP 2010-243251 filed in the Japan Patent Office on Oct. 29, 2010, the entire content of which is hereby incorporated by reference.

What is claimed is:

1. A semiconductor device comprising a fin-type field effect transistor, the field effect transistor comprising:
   a semiconductor base;
   a semiconductor fin on the semiconductor base;
   a gate electrode on the semiconductor base and the semiconductor fin;
   in cross section, a gate insulating layer between the semiconductor base and the gate electrode, the gate insulating layer including a bottom layer between the semiconductor layer and the gate electrode and walls connected to and extending from the bottom layer, each of the gate insulating layer walls including an inside surface facing the gate electrode and an outside surface facing away from the gate electrode;
   in the cross section, a first insulating film including walls, each first insulating layer wall having an inside surface and an outside surface, each inside surface of the first insulating film walls being adjacent a respective outside surface of one of the gate insulating layer walls; and
   in the cross section, a second insulating film including walls, each second insulating film wall having an inside surface adjacent the outside surface of a respective one of the first insulating film walls,
   wherein,
   in the cross section, a distance along a gate length direction between the inside surface of one of the gate insulating layer walls and the inside surface of one of the second insulating film walls at first position along a gate height direction is greater than a distance between the inside surface of the one of the gate insulating layer walls and the inside surface of the one of the second insulating film walls at a second position along the gate height direction, the first position being between the semiconductor base and the second position,
   in the cross section, the gate electrode is T-shaped with a rectangular top portion and a rectangular bottom portion; and
   a top of the semiconductor fin is between first position and the second position and within the gate-height of the rectangular bottom portion of the gate electrode.

2. The semiconductor device of claim 1, wherein the second insulating film walls extend more in a gate height direction than do the first insulating walls.

3. The semiconductor device of claim 1, wherein the second insulating film walls are adjacent the gate electrode at the second position.

4. The semiconductor device of claim 1, wherein the gate electrode comprises a buried metal layer and at least one work function layer between the buried metal layer and the gate insulating film.

5. The semiconductor device of claim 1, wherein the gate electrode comprises a buried metal layer and two work function layers between the buried metal layer and the gate insulating film.

6. A fin-type field effect transistor comprising:
   a semiconductor base;
   a semiconductor fin on the semiconductor base;
   a gate electrode on the semiconductor base and the semiconductor fin; and
   a gate insulating layer between the semiconductor base and the gate electrode,
   wherein,
   the gate electrode has a top portion and a lower portion between the top portion and the semiconductor base,
   in cross section, each of the top portion and the bottom portion is rectangular and the top portion is wider than the lower portion in a gate length direction so as to impart a T-shape to the gate electrode, and
   a top portion of the semiconductor fin is between the top portion of the gate electrode and the semiconductor base and within the gate-height of the lower portion of the gate electrode.

7. The fin-type field effect transistor of claim 6, further comprising a first insulating film surrounding the lower portion of the gate electrode in the gate length direction and a second insulating film surrounding the lower portion and the upper portion of the electrode in the gate length direction, the first insulting film being between the gate electrode and the second insulating film.

8. The fin-type field effect transistor of claim 6, wherein the gate electrode comprises a buried metal layer and at least one work function layer between the buried metal layer and the gate insulating layer.

9. The fin-type field effect transistor of claim 6, wherein the gate electrode comprises a buried metal layer and two work function layers between the buried metal layer and the gate insulating layer.

* * * * *